US012681042B2

(12) United States Patent
Lou et al.

(10) Patent No.: US 12,681,042 B2
(45) Date of Patent: Jul. 14, 2026

(54) SOCKET ASSEMBLY

(71) Applicant: XINGR TECHNOLOGIES (ZHEJIANG) LIMITED, Yiwu City (CN)

(72) Inventors: Choon Leong Lou, Singapore (SG); Ho-Yeh Chen, Zhubei City (TW)

(73) Assignee: XINGR TECHNOLOGIES (ZHEJIANG) LIMITED, Yiwu City (CN)

( * ) Notice: Subject to any disclaimer, the term of this patent is extended or adjusted under 35 U.S.C. 154(b) by 162 days.

(21) Appl. No.: 18/669,700

(22) Filed: May 21, 2024

(65) Prior Publication Data

US 2025/0283910 A1      Sep. 11, 2025

(30) Foreign Application Priority Data

Mar. 7, 2024      (CN) .......................... 202410263658.5

(51) Int. Cl.
 *G01R 1/04* (2006.01)
 *H01R 13/6585* (2011.01)
(52) U.S. Cl.
 CPC ....... *G01R 1/0466* (2013.01); *H01R 13/6585* (2013.01)
(58) Field of Classification Search
 CPC .... G01R 1/0466; G01R 1/045; G01R 1/0483; G01R 1/0441; G01R 1/06716; G01R 31/2863; G01R 1/0416; G01R 1/06733; G01R 1/06772; G01R 1/18; G01R 31/2896

USPC ...................................................... 324/753.03
See application file for complete search history.

(56) References Cited

U.S. PATENT DOCUMENTS

| | | | | |
|---|---|---|---|---|
| 3,526,867 | A | * | 9/1970 | Keeler ................. H01R 12/716 439/74 |
| 5,037,332 | A | | 8/1991 | Wilson |
| 5,089,880 | A | * | 2/1992 | Meyer ..................... H01L 23/32 257/746 |
| 5,199,889 | A | * | 4/1993 | McDevitt, Jr. ....... H05K 7/1084 439/71 |
| 5,201,855 | A | | 4/1993 | Ikola |
| 5,299,939 | A | * | 4/1994 | Walker .................. H01R 12/00 439/74 |
| 5,562,462 | A | | 10/1996 | Matsuba et al. |
| 5,940,674 | A | * | 8/1999 | Sachs ..................... B33Y 10/00 419/36 |
| 6,183,268 | B1 | * | 2/2001 | Consoli .................. H01R 12/52 439/74 |

(Continued)

FOREIGN PATENT DOCUMENTS

JP      S59-128184 U      8/1984
JP      2007-178163 A      7/2007

(Continued)

*Primary Examiner* — Christopher P Mcandrew
(74) *Attorney, Agent, or Firm* — MUNCY, GEISSLER, OLDS & LOWE, P.C.

(57) ABSTRACT

The present disclosure provides a socket assembly thereof. The socket assembly includes a body, a plurality of shield components and a plurality of retractable probes. The body has a plurality of through holes and a plurality of recesses. The through holes accommodate the retractable probes. At least one recess is formed between any adjacent two through holes. The shield components are inserted in the recesses.

20 Claims, 28 Drawing Sheets

(56)                    References Cited

U.S. PATENT DOCUMENTS

| | | | | |
|---|---|---|---|---|
| 6,717,422 | B2 * | 4/2004 | Akram | G01R 1/0483 |
| | | | | 324/750.16 |
| 9,733,304 | B2 * | 8/2017 | Gandhi | G01R 31/2887 |
| 2001/0054510 | A1 * | 12/2001 | Yoshida | G01R 1/0408 |
| | | | | 174/250 |
| 2004/0135592 | A1 * | 7/2004 | Cuevas | G01R 1/0433 |
| | | | | 324/750.24 |
| 2012/0233849 | A1 * | 9/2012 | Smeys | H01F 17/0006 |
| | | | | 29/604 |
| 2013/0050055 | A1 * | 2/2013 | Paradiso | H01P 3/06 |
| | | | | 343/893 |
| 2015/0233973 | A1 | 8/2015 | Wooden et al. | |
| 2016/0341790 | A1 * | 11/2016 | Thompson | H01Q 1/2283 |
| 2018/0059176 | A1 * | 3/2018 | Ding | G01R 35/005 |
| 2020/0141980 | A1 * | 5/2020 | Kim | G01R 1/07314 |
| 2022/0373576 | A1 * | 11/2022 | Baek | G01R 1/07314 |
| 2023/0341436 | A1 * | 10/2023 | Arai | G01R 1/0433 |
| 2024/0036107 | A1 * | 2/2024 | Lou | G01R 1/18 |

FOREIGN PATENT DOCUMENTS

| | | | | | | |
|---|---|---|---|---|---|---|
| JP | 2013-020970 | A | | 1/2013 | | |
| JP | 2013-251164 | A | | 12/2013 | | |
| JP | 2024-001979 | A | | 1/2024 | | |
| KR | 10-2014-0138042 | | | 12/2014 | | |
| KR | 102489549 | B1 | * | 1/2023 | | G01R 31/2889 |
| SG | 11202009248W | A | * | 10/2020 | | G01R 1/045 |
| WO | WO-2004005944 | A1 | * | 1/2004 | | H01R 33/76 |
| WO | WO-2017164631 | A1 | * | 9/2017 | | H01R 13/24 |

* cited by examiner

111S2

1110

111

SOCKET ASSEMBLY

BACKGROUND OF THE PRESENT DISCLOSURE

Field of the Present Disclosure

The present disclosure relates to socket assemblies, and more particularly to a socket assembly having a shielding function and adapted for use with a chip test socket.

Description of the Prior Art

Upon completion of the packaging of chips, the packaged chips have to undergo a test to screen out unsatisfactory packaged chips. In general, the packaged chips undergo a test with a socket equipped with test probes, the test probes are usually elastic probes commonly known as pogo pins. One end of each pogo pin is in contact with a circuit board on the socket, and the other end of the pogo pin is in contact with the pins of a packaged chip, so as to perform the test.

The socket has through holes for receiving the pogo pins. However, the distance between the through holes is so short that signals associated with adjacent pogo pins during the test interfere with each other to cause the detriment of the precision of the test results. The interference is especially severe during a high-frequency signal test. Therefore, it is imperative to reduce signal interference and thereby enhance testing stability and precision.

The above description of the "prior art" merely serves to reveal background technology but is not intended to acknowledge that the above description of the "prior art" discloses the subject matters of the disclosure, constitutes the prior art of the disclosure, or is part of the disclosure.

SUMMARY OF THE PRESENT DISCLOSURE

In view of the aforesaid conventional issue of test signal interference, present disclosure provides a socket assembly.

An embodiment of the present disclosure provides a socket assembly used with a chip test socket, the socket assembly comprising a body, a plurality of first shield components, a plurality of second shield components and a plurality of pogo pins. The body has an upper surface, a lower surface opposite to the upper surface, a plurality of first through hole arrays, a plurality of second through hole arrays, a plurality of first grooves and a plurality of second grooves. Each first through hole array comprises a plurality of first through holes aligned in a first direction. Each second through hole array comprises a plurality of second through holes aligned in a second direction. Each first groove extends in the first direction and is disposed between any two adjacent first through hole arrays. Each second groove extends in the second direction and is disposed between any two adjacent second through hole arrays. Each first shield component has a first surface, and the plurality of first shield components are insertedly disposed in the plurality of first grooves. Each second shield component has a second surface, and the plurality of second shield components are insertedly disposed in the plurality of second grooves. The plurality of pogo pins are disposed in the plurality of first through holes and the plurality of second through holes. A first distance is defined between the first surface of each first shield component and the lower surface. A second distance is defined between the second surface of each second shield component and the lower surface.

Another embodiment of the present disclosure provides a socket assembly comprising a body, a plurality of shield components and a plurality of pogo pins. At least a first portion of a plurality of through holes form a plurality of first through hole arrays. At least a second portion of the plurality of through holes form a plurality of second through hole arrays. At least a first portion of a plurality of grooves are disposed between any two adjacent first through hole arrays. At least a second portion of the plurality of grooves are disposed between any two adjacent second through hole arrays. The plurality of shield components are insertedly disposed in the plurality of grooves. The plurality of pogo pins are disposed in the plurality of through holes.

Therefore, a socket assembly of the present disclosure includes shield components for shielding signal interference between pogo pins during a test to effectively shield signal interference and thereby enhance testing stability and precision.

The technical features and advantages of the disclosure are described generally and extensively above to render the detailed description of the disclosure below comprehensible. Other technical features and advantages of the subject matters of the claims of the disclosure are described below. Persons skilled in the art understand that concepts and specific embodiments presented below can be easily used to amend or design any other structures or manufacturing processes and thereby achieve the same objective as the disclosure. Persons skilled in the art also understand that the aforesaid equivalent constructions cannot depart from the spirit and scope defined in the appended claims of the disclosure.

BRIEF DESCRIPTION OF THE DRAWINGS

Persons skilled in the art can gain insight into the disclosure by referring to the embodiments, claims and drawings of the disclosure. In the drawings, like components are denoted by like reference numerals.

FIG. 1I is a cross-sectional view of the body according to some embodiments of the present disclosure.

DETAILED DESCRIPTION OF THE EMBODIMENTS

Figure 1A:
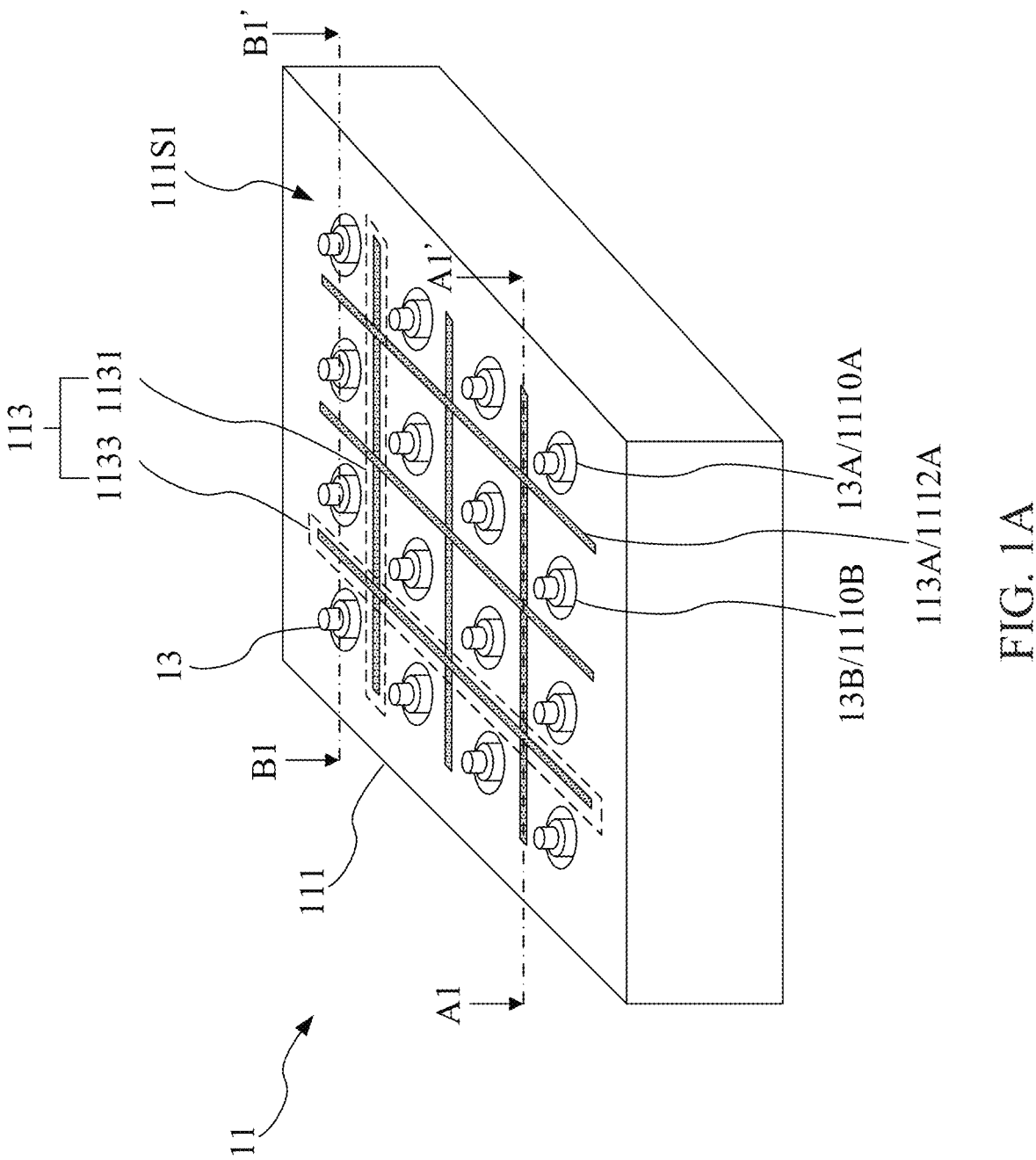
FIG. 1A is a perspective view of a socket assembly according to some embodiments of the present disclosure.

The description below is accompanied by drawings that are incorporated into and constitute a part of the specification to illustrate the embodiments of the disclosure. However, the disclosure is not limited to the embodiments. The embodiments described below may be appropriately integrated to attain any other embodiments.

The purpose of the expressions "an embodiment," "embodiment," "exemplary embodiment," "other embodiments" and "another embodiment" used herein is to state that the embodiments of the disclosure can include specific features, structures or characteristics. However, not every embodiment must include the specific features, structures or characteristics. Furthermore, repeated use of the expression "in an embodiment" does not necessarily imply referring to the same embodiment, as the possibility of referring to the same embodiment should not be ruled out. Socket assemblies mentioned herein are mainly for use in chip tests performed in the course of semiconductor testing.

The description below goes into detail about steps and structures in order for the disclosure to be fully comprehensible. Obviously, the embodiments of the disclosure do not place any limitations on specific details well known among persons skilled in the art. In addition, well-known structures and steps are not reiterated herein such that no limitations are unnecessarily placed on the disclosure. Preferred embodiments of the disclosure are described in detail below. However, in addition to the detailed description, the disclosure can be extensively implemented in other embodiments. The scope of the disclosure is defined by the appended claims rather than restricted to the detailed description.

The description below provides different embodiments or examples for use in implementing different features of the disclosure. Specific embodiments or examples of components and arrangements are described in detail herein to simplify the contents of the disclosure. The specific embodiments and examples are illustrative rather than restrictive of the disclosure. For instance, dimensions of components are not restricted to disclosed ranges or values but are based on process criteria and/or expected nature of devices. In the description below, an embodiment of forming a first feature on or above a second feature includes any embodiments in which the first and second features thus formed are in direct contact with each other or includes any embodiments in which an additional feature is formed between the first feature and the second feature, allowing the first and second features to be not in direct contact with each other. For the sake of conciseness and clarity, the accompanying drawings are not drawn to scale. For the sake of conciseness, some layers/features are omitted from the accompanying drawings.

In addition, for explanatory purposes, expressions about spatial relationships, such as "beneath," "below," "lower," "above" and "upper," are used herein to explain the relationship between one component (or feature) and another component (or feature), as shown in the accompanying drawings. The expressions about spatial relationships are intended to indicate any other directions in which the components are used or operated in addition to the directions depicted in the accompanying drawings. The components may have any other directions (be rotated by 90 degrees or be aligned with another direction), and the expressions about spatial relationships can be construed accordingly.

An embodiment of the present disclosure relates to a socket assembly for a chip test socket, where the socket assembly includes a body, a plurality of shield components and a plurality of pogo pins. The plurality of pogo pins are configured to test high-frequency signals. The body is made from an insulating material, and has a plurality of through holes and a plurality of grooves. At least one of the grooves is disposed between two adjacent through holes. The plurality of through holes receive the plurality of pogo pins. The plurality of shield components are made from a conductive metallic material and are insertedly disposed in the plurality of grooves. Owing to the aforesaid technical features, the insulating property of the body precludes the electrical contact between the pogo pins, and metallic shield components are insertedly disposed between the through holes where the pogo pins are received in, so as to effectively shield signal interference associated with the pogo pins during testing, especially signal interference during the high-frequency signal testing. Therefore, when the socket assembly is mounted on a corresponding socket, the socket assembly can effectively shield signal interference to enhance testing stability and precision. The details of required structural features are illustrated by embodiments and described below.

Figure 1B:
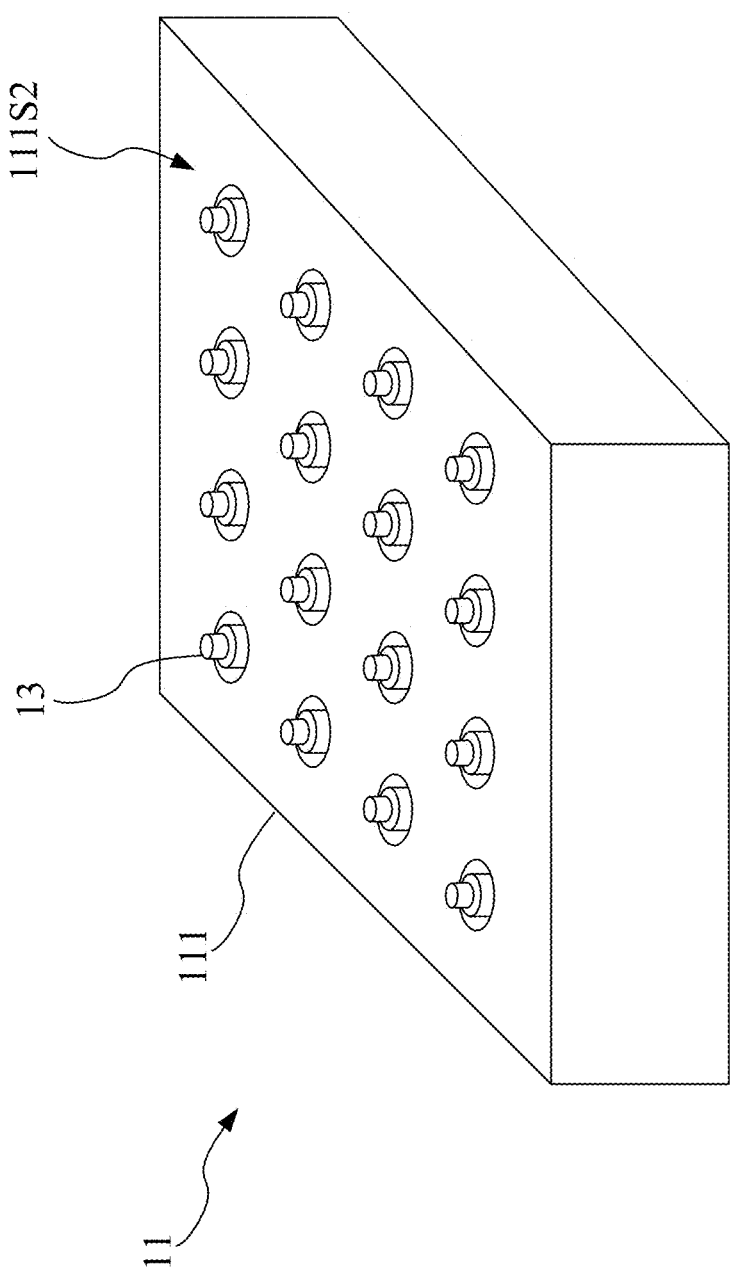
FIG. 1B is a perspective view of the socket assembly according to some embodiments of the present disclosure.
Figure 1C:
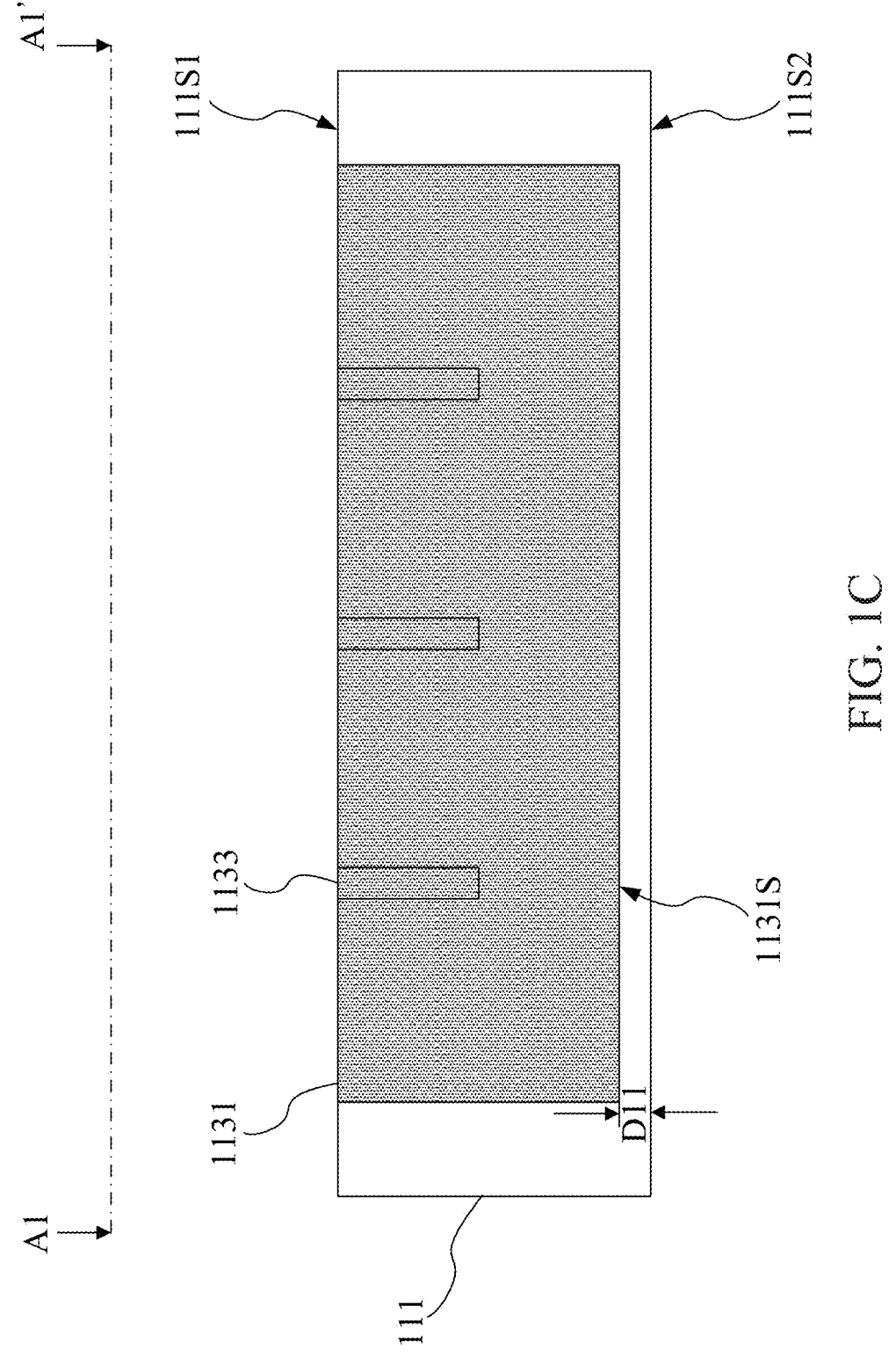
FIG. 1C is a cross-sectional view of the socket assembly according to some embodiments of the present disclosure.
Figure 1D:
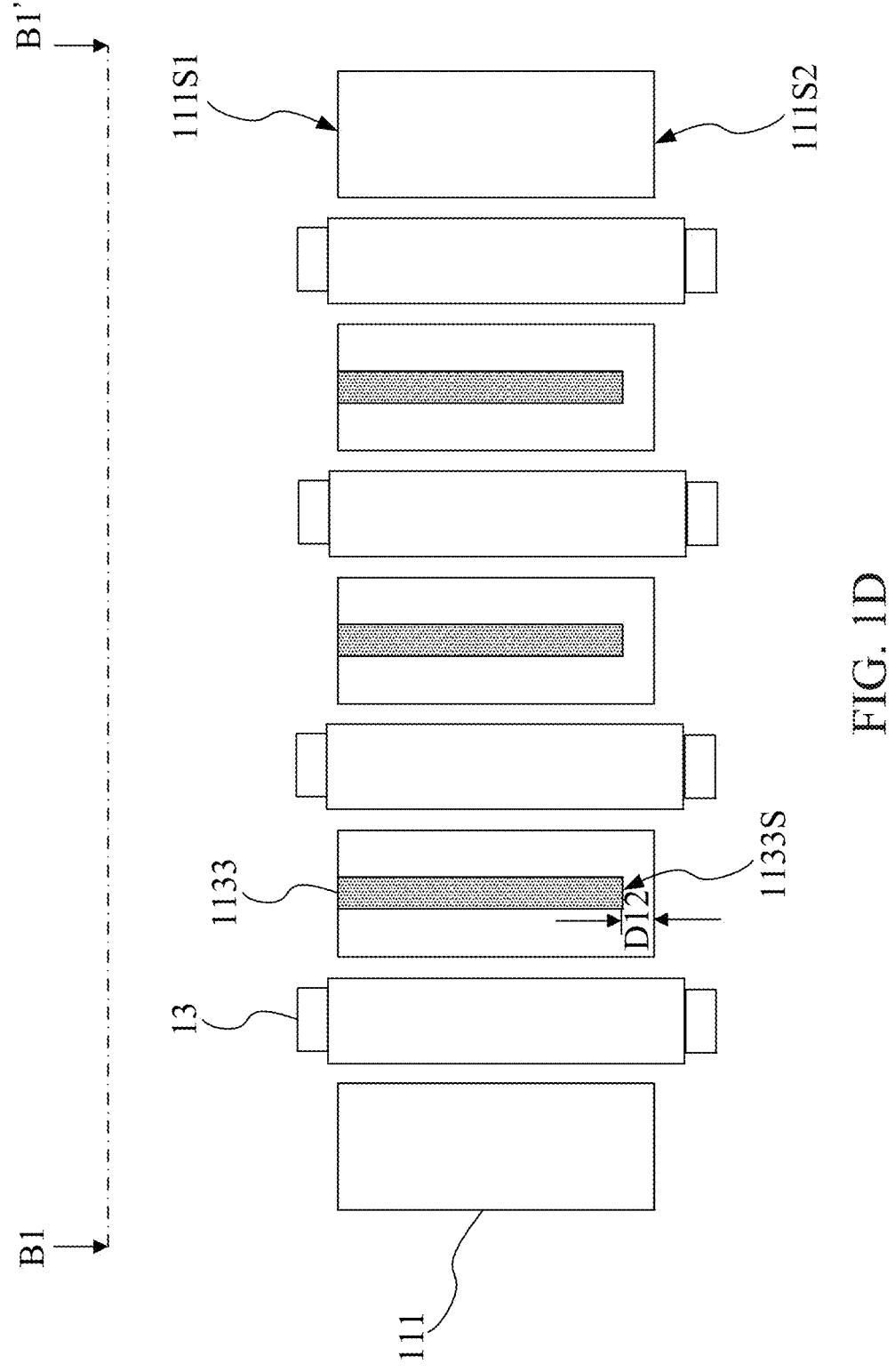
FIG. 1D is a cross-sectional view of the socket assembly according to some embodiments of the present disclosure.

Reference is made to FIG. 1A through FIG. 1D. FIG. 1A is a perspective view of a socket assembly 11 according to some embodiments of the present disclosure. FIG. 1B is another perspective view of the socket assembly 11 according to some embodiments of the present disclosure. FIG. 1C is a cross-sectional view of the socket assembly 11 according to some embodiments of the present disclosure. FIG. 1D is another cross-sectional view of the socket assembly 11 according to some embodiments of the present disclosure. Specifically, the socket assembly 11 includes a body 111, a plurality of shield components 113 and a plurality of pogo pins 13. The body 111 has an upper surface 111S1 and a lower surface 111S2 opposite to the upper surface 111S1.

Figure 1E:
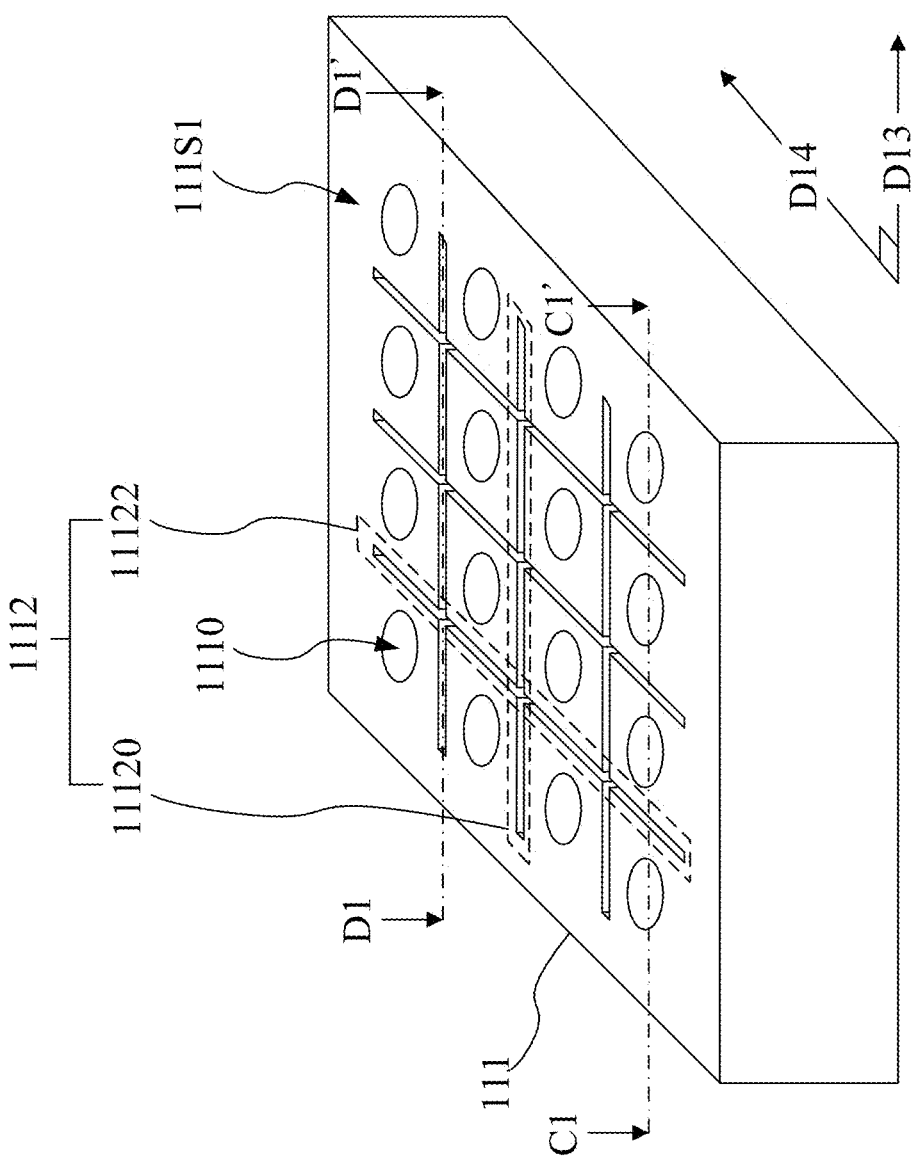
FIG. 1E is a perspective view of a body according to some embodiments of the present disclosure.
Figure 1F:
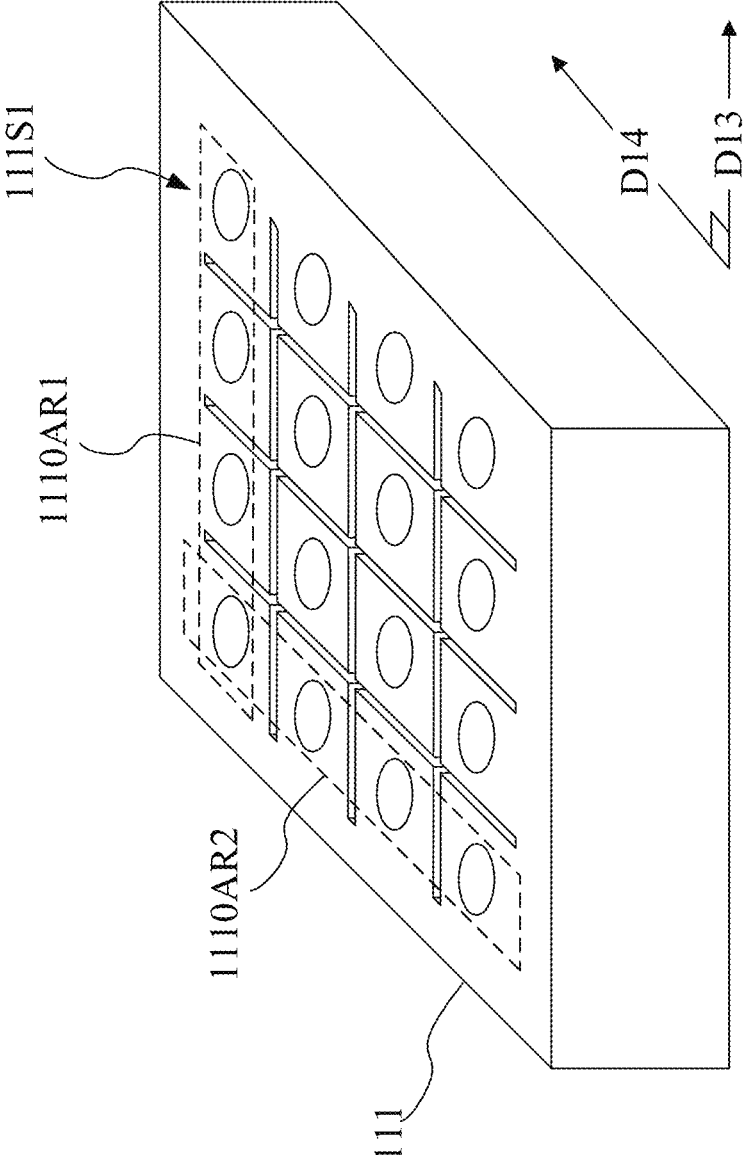
FIG. 1F is a perspective view of the body according to some embodiments of the present disclosure.
Figure 1G:
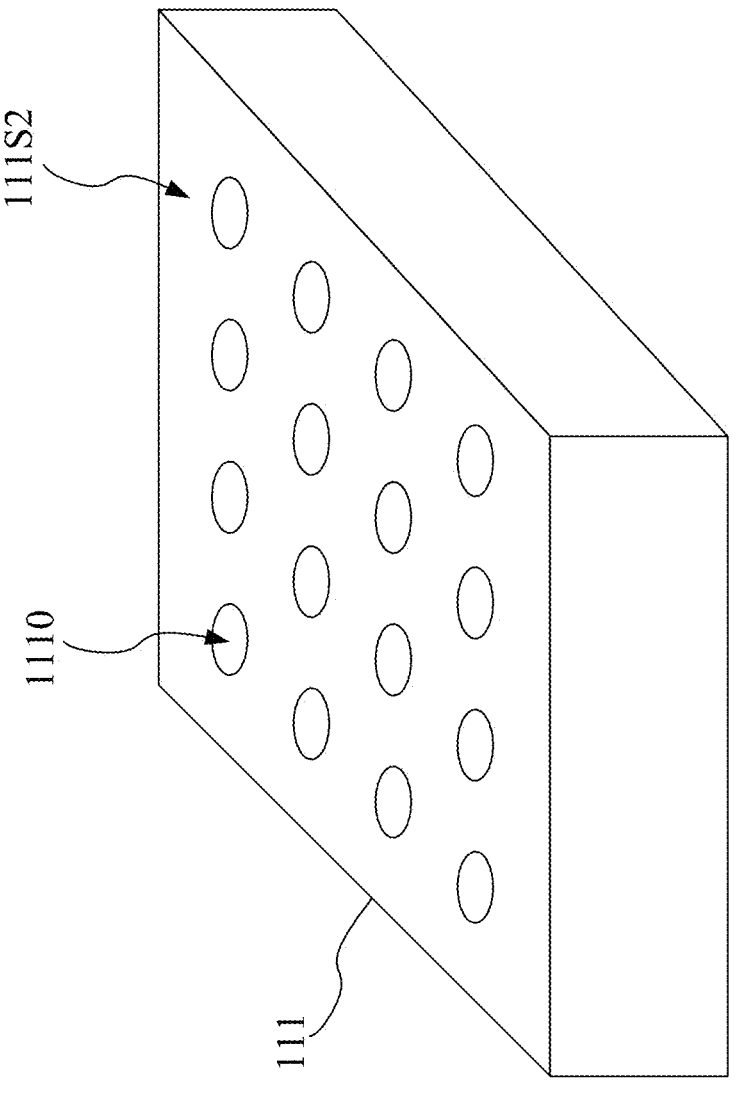
FIG. 1G is a perspective view of the body according to some embodiments of the present disclosure.
Figure 1H:
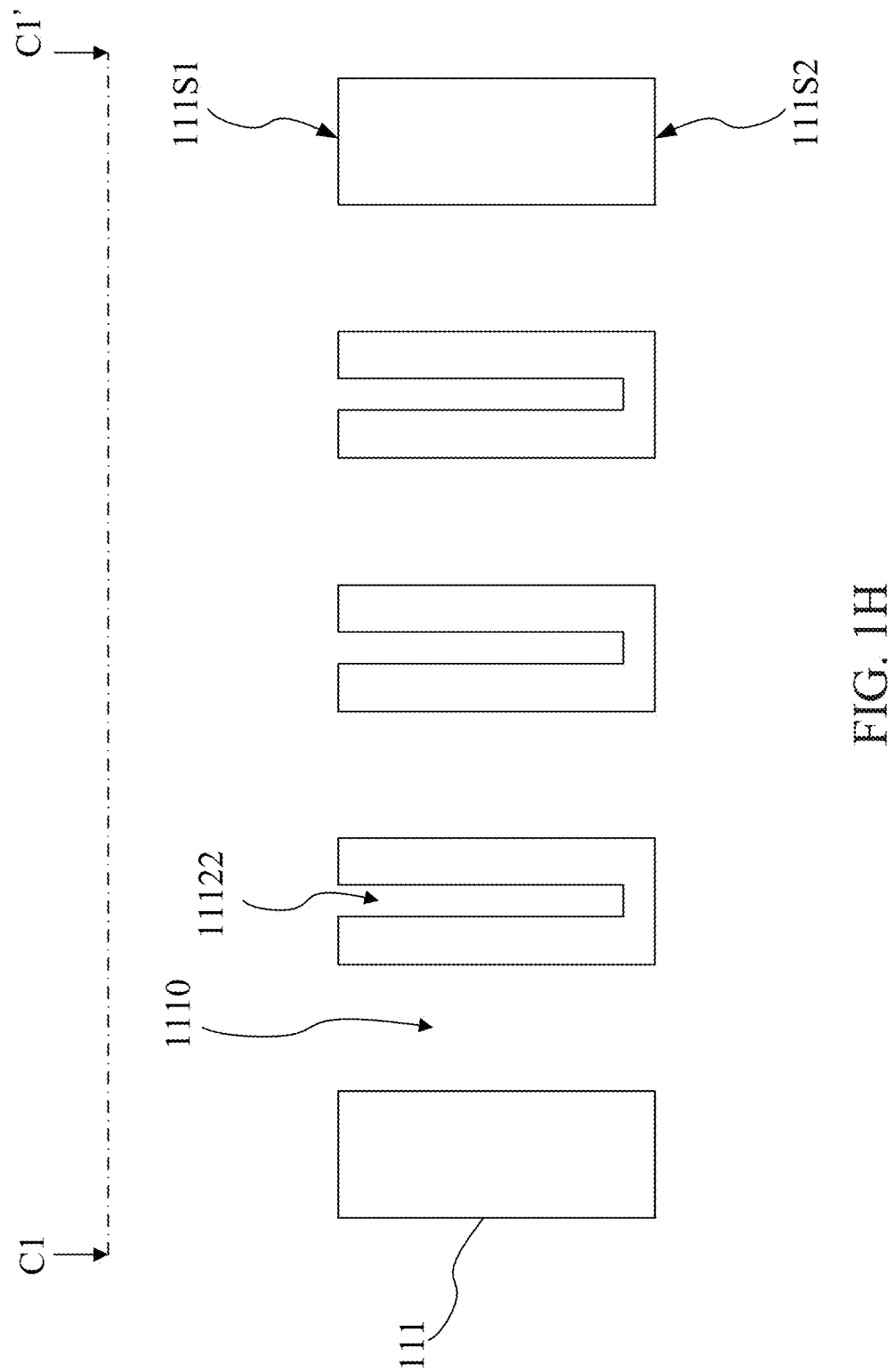
FIG. 1H is a cross-sectional view of the body according to some embodiments of the present disclosure.
Figure 11:
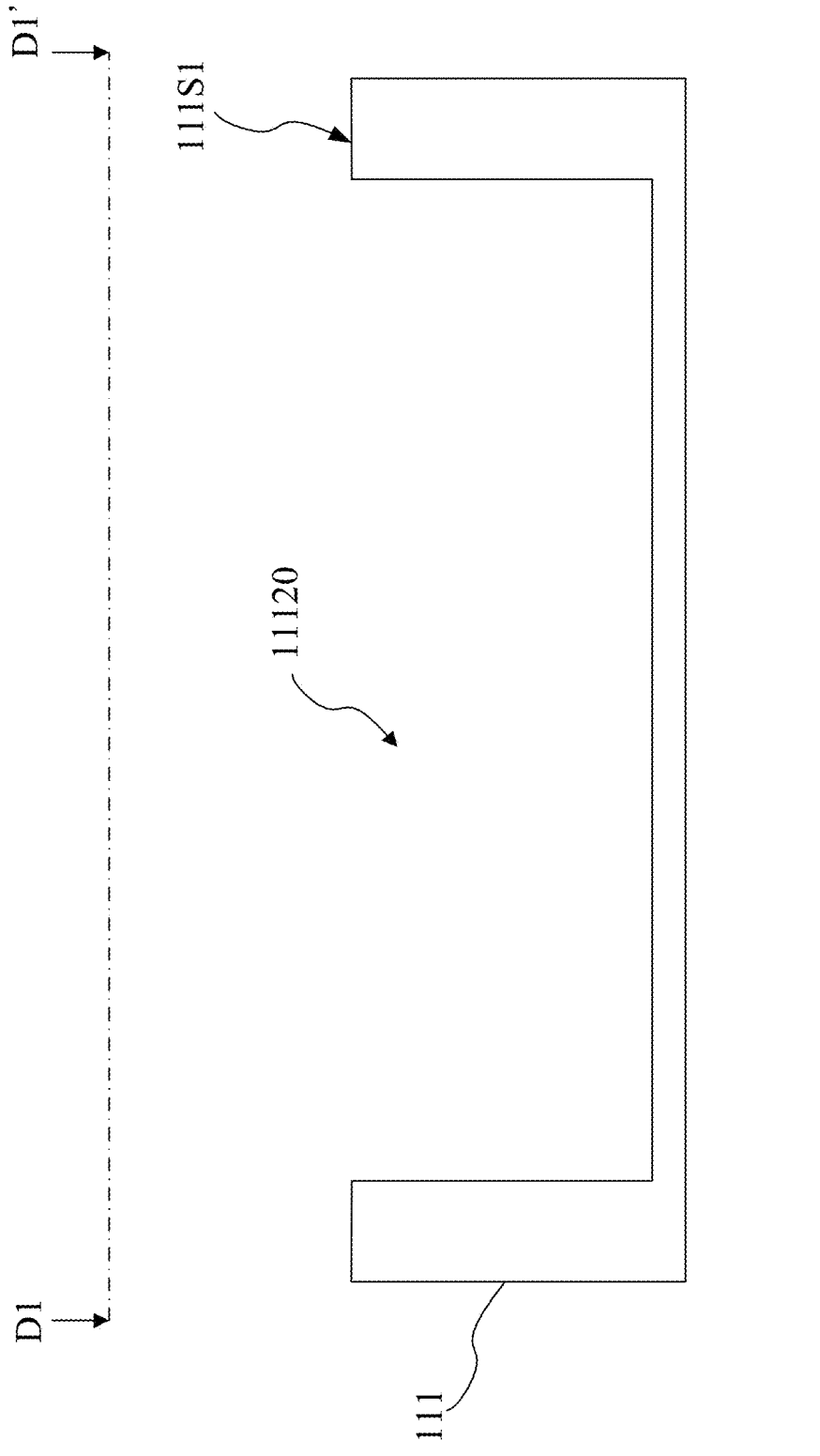

Reference is made to FIG. 1E through FIG. 1I. FIGS. 1E and 1F are perspective views of the body 111 according to some embodiments of the present disclosure. FIG. 1G is another perspective view of the body 111 according to some embodiments of the present disclosure. FIG. 1H is a cross-sectional view of the body 111 according to some embodiments of the present disclosure. FIG. 1I is another cross-sectional view of the body 111 according to some embodiments of the present disclosure. Specifically, the body 111 has multiple through holes 1110 and multiple grooves 1112. At least a first portion of the through holes 1110 form a plurality of first through hole arrays 1110AR1. The through holes 1110 in each first through hole array 1110AR1 are defined as first through holes and aligned with a first direction D13. At least a second portion of the through holes 1110 form a plurality of second through hole arrays 1110AR2. The through holes 1110 in each second through hole array 1110AR2 are defined as second through holes and aligned with a second direction D14. In some embodiments, one of the first through holes and one of the second through holes can be the same through hole, whereas the first through holes are distinguished from the second through holes according to the angles of different through hole arrays.

In some embodiments, the multiple grooves 1112 include multiple first grooves 11120 and multiple second grooves 11122. Each first groove 11120 is extended in the first direction D13 and disposed between two adjacent first through hole arrays 1110AR1. Each second groove 11122 is extended in the second direction D14 and disposed between two adjacent second through hole arrays 1110AR2.

In some embodiments, multiple shield components 113 include multiple first shield components 1131 and multiple second shield components 1133. The first shield components 1131 are inserted into the first grooves 11120 from the upper surface 111S1, respectively. The second shield components 1133 are inserted into the second grooves 11122 from the upper surface 111S1, respectively. The through holes 1110 receive the pogo pins 13. In some embodiments, the first shield components 1131 and second shield components 1133 are staggered with an engagement structure disposed between every two adjacent shield components.

In some embodiments, each first shield component 1131 has a first surface 1131S, and each second shield component 1133 has a second surface 1133S. The first surfaces 1131S, the second surfaces 1133S and the lower surface 111S2 substantially face the same direction. Upon the insertion of the first shield components 1131 and second shield components 1133 into the first and second grooves respectively, a first distance D11 is defined between the lower surface 111S2 and each first surface 1131S, and a second distance D12 is defined between the lower surface 111S2 and each second surface 1133S.

In some embodiments, the upper surface 111S1 and the lower surface 111S2 are substantially parallel, allowing the first surfaces 1131S of the first shield components 1131 to be substantially coplanar, the second surfaces 1133S of the second shield components 1133 to be substantially coplanar, the first surfaces 1131S and the second surfaces 1133S to be substantially coplanar, and the first distance D11 to be substantially equal to the second distance D12, but the aforesaid technical features are not restrictive of the embodiments of present disclosure.

Therefore, owing to the structure of the socket assembly 11, when the pogo pins 13 received in two adjacent through holes 1110 are used in the signal transmission during a chip test, the signal interference is effectively shielded by using the shield components 113 which are inserted into the grooves 1112 disposed between two adjacent through holes 1110. Referring to FIG. 1A, for example, when the pogo pins

13A, 13B received in the through holes 1110A, 1110B are used in the signal transmission during a chip test, the signal interference is effectively shielded by using the shield components 113A which are inserted into the groove 1112A disposed between the through hole 1110A and the through hole 1110B.

Figure 2A:
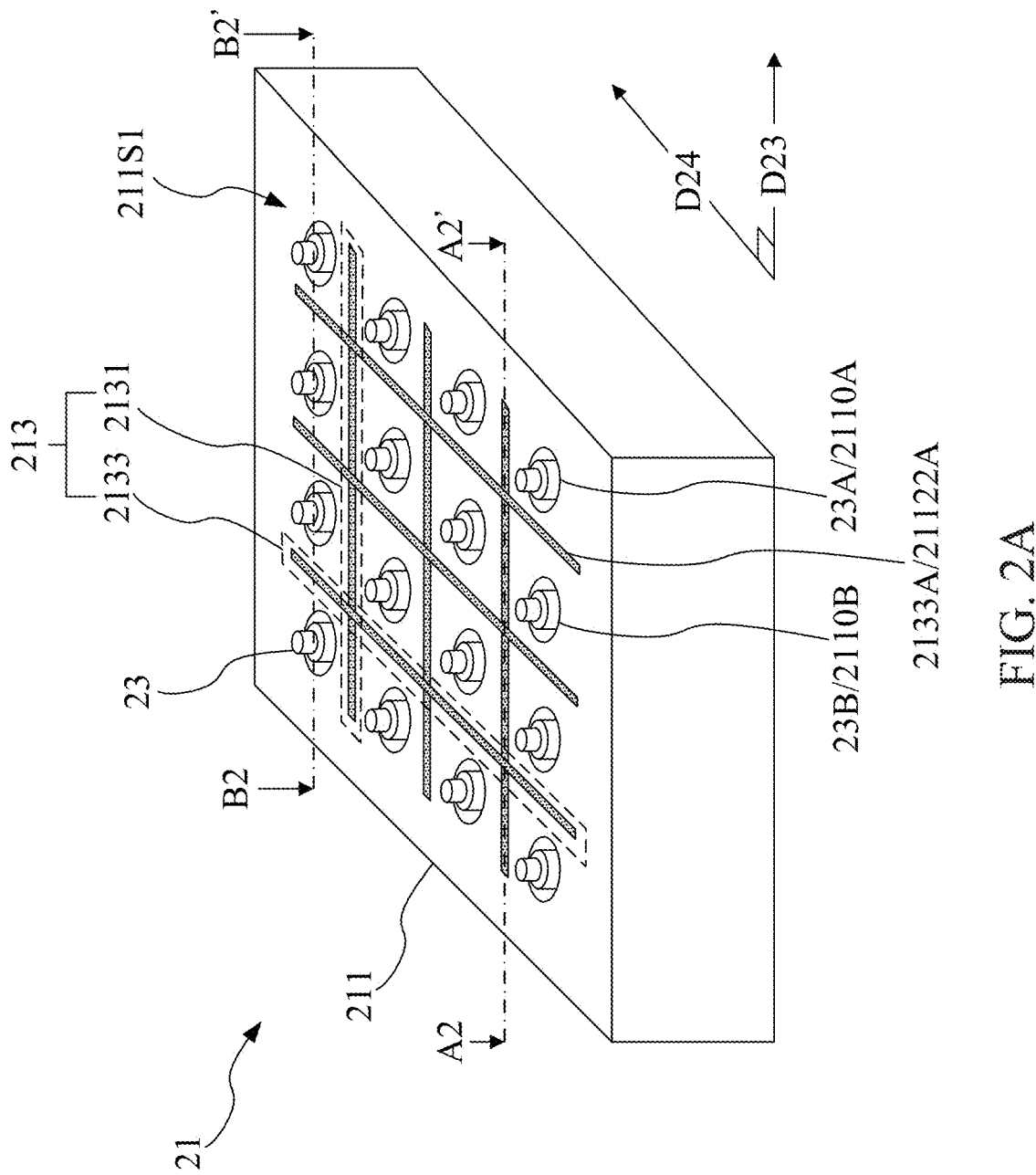
FIG. 2A is a perspective view of a socket assembly according to some embodiments of the present disclosure.
Figure 2B:
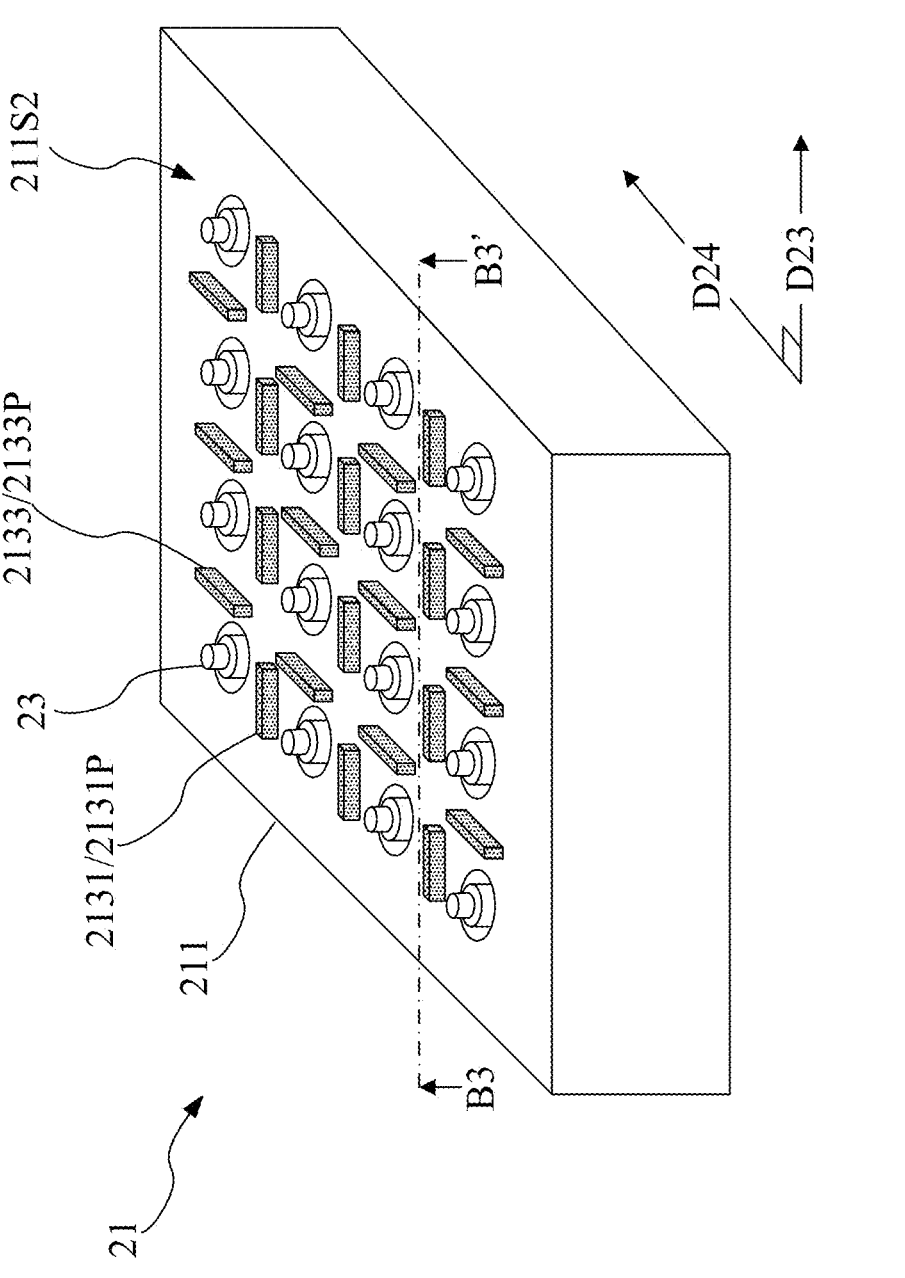
FIG. 2B is a perspective view of the socket assembly according to some embodiments of the present disclosure.
Figure 2C:
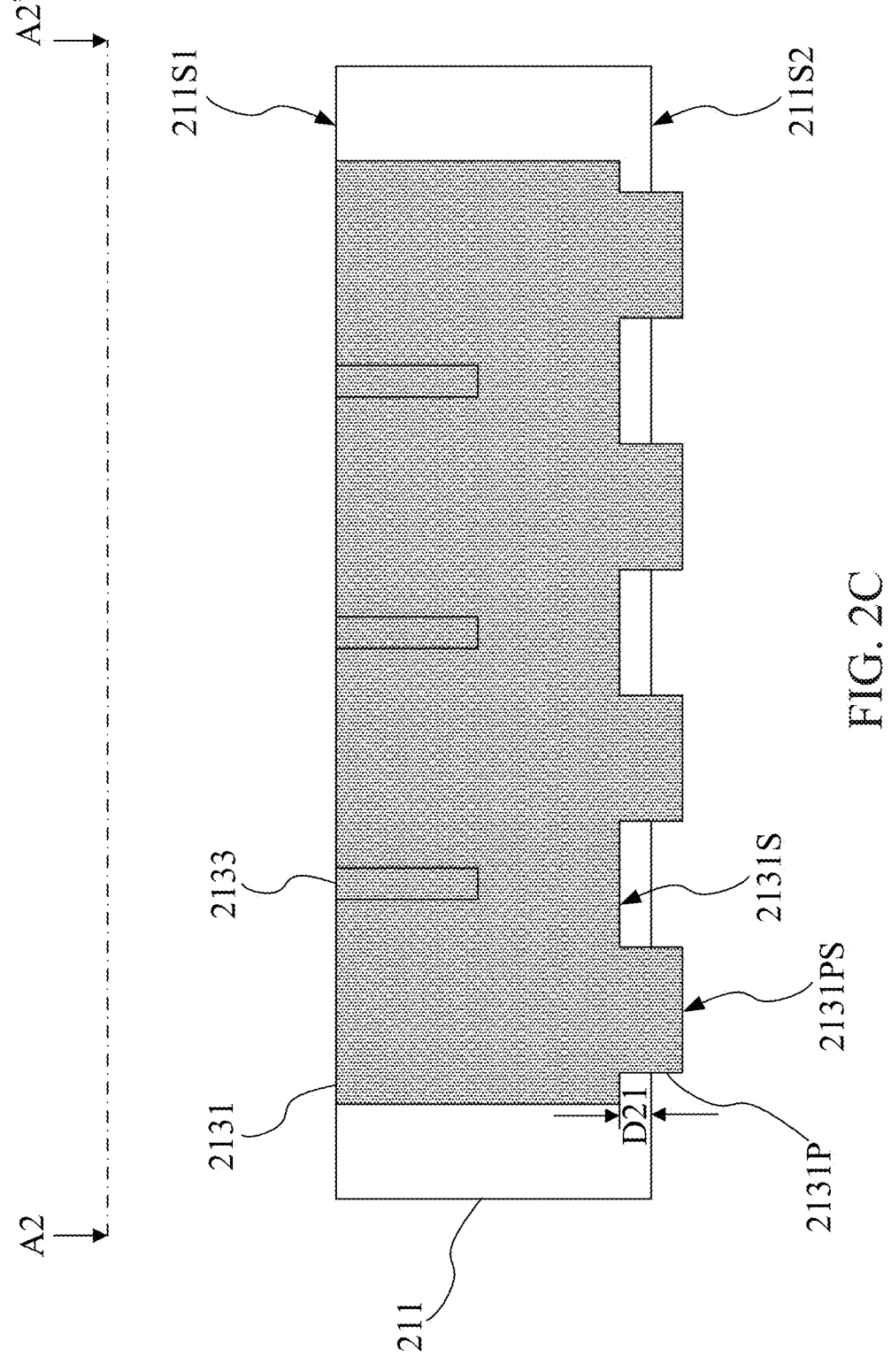
FIG. 2C is a cross-sectional view of the socket assembly according to some embodiments of the present disclosure.
Figure 2D:
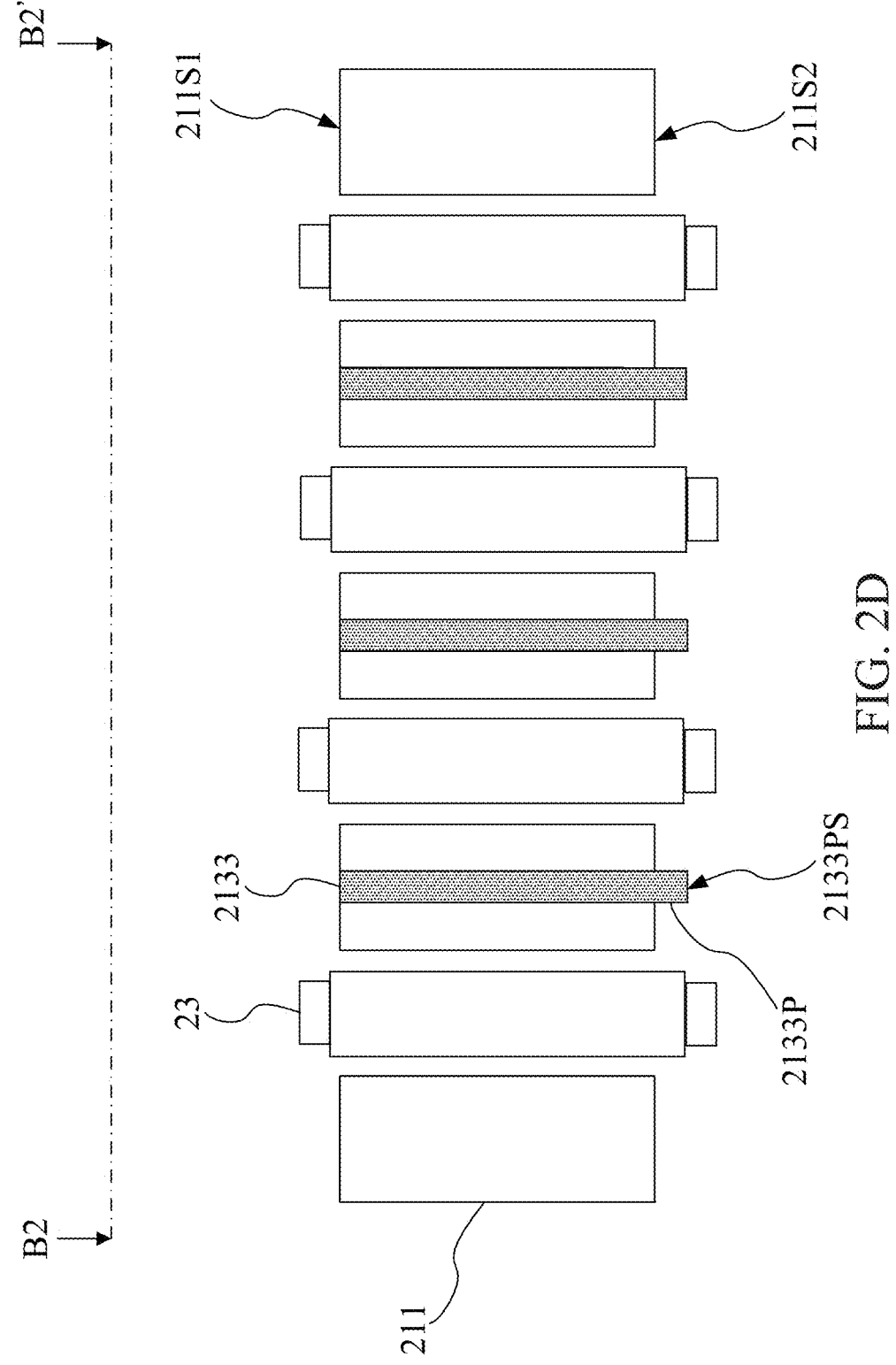
FIG. 2D is a cross-sectional view of the socket assembly according to some embodiments of the present disclosure.
Figure 2E:
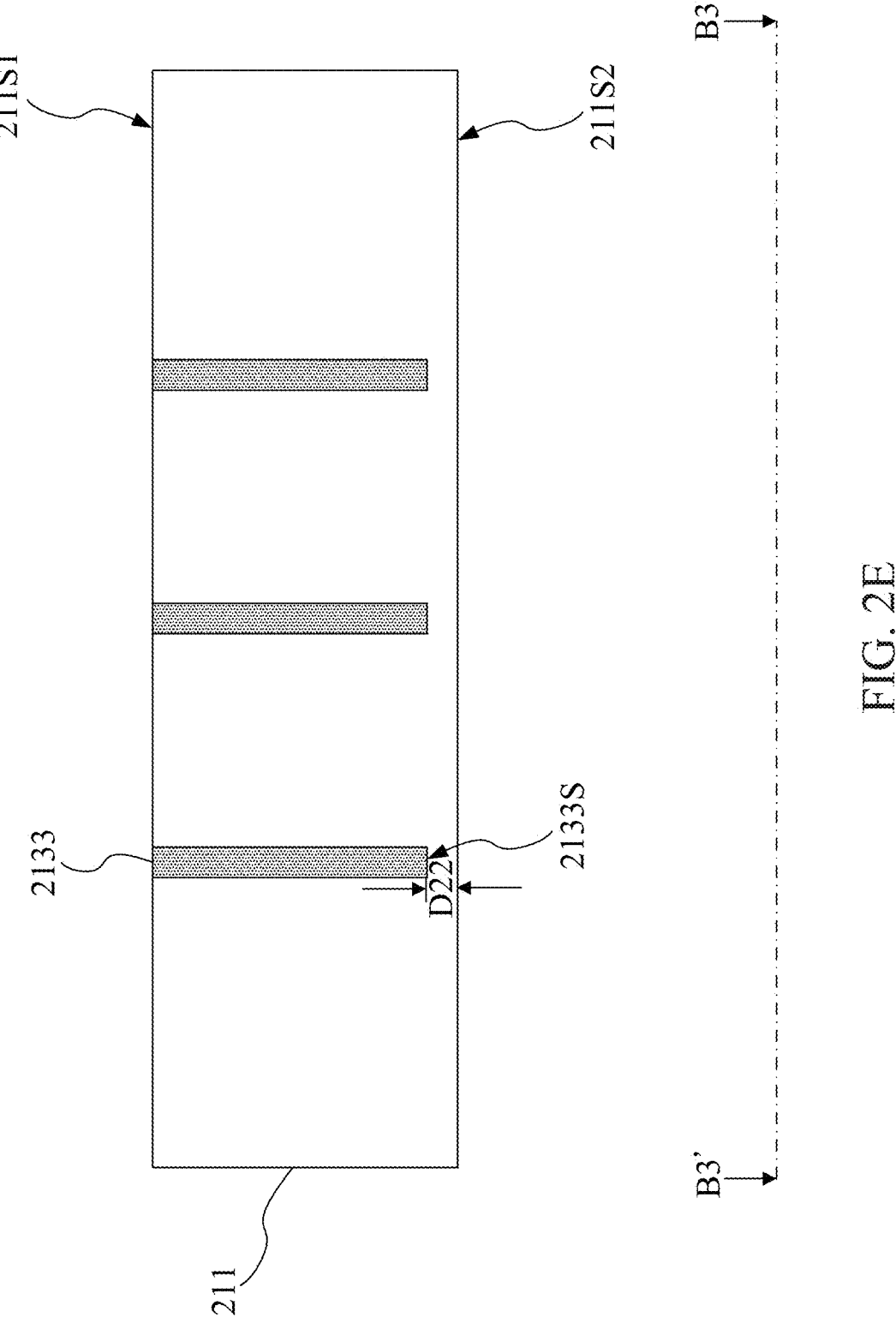
FIG. 2E is a cross-sectional view of the socket assembly according to some embodiments of the present disclosure.

Reference is made to FIG. 2A through FIG. 2E. FIG. 2A is a perspective view of a socket assembly 21 according to some embodiments of the present disclosure. FIG. 2B is another perspective view of the socket assembly 21 according to some embodiments of the present disclosure. FIG. 2C through FIG. 2E are cross-sectional views of the socket assembly 21 according to some embodiments of the present disclosure. Specifically, the socket assembly 21 includes a body 211, a plurality of shield components 213 and a plurality of pogo pins 23. The body 211 has an upper surface 211S1 and a lower surface 211S2 opposite to the upper surface 211S1.

Figure 2F:
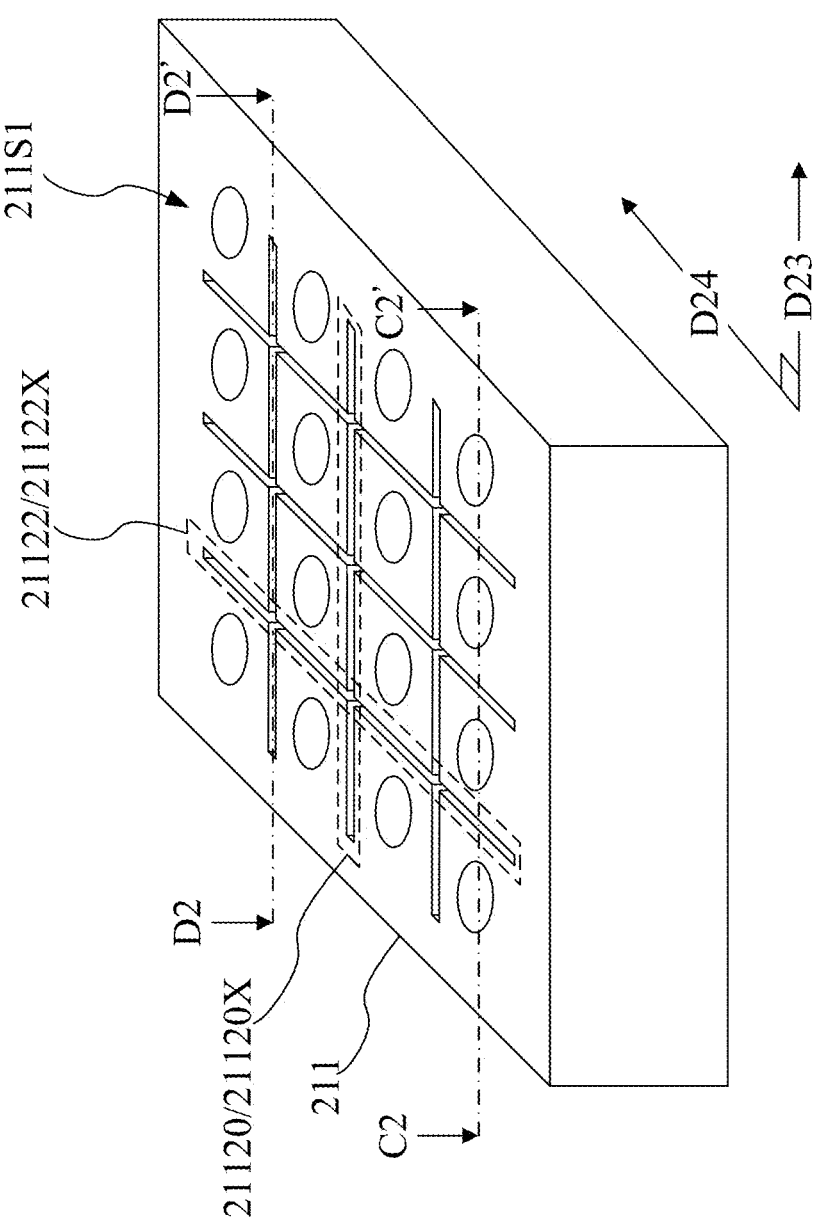
FIG. 2F is a perspective view of the body according to some embodiments of the present disclosure.
Figure 2G:
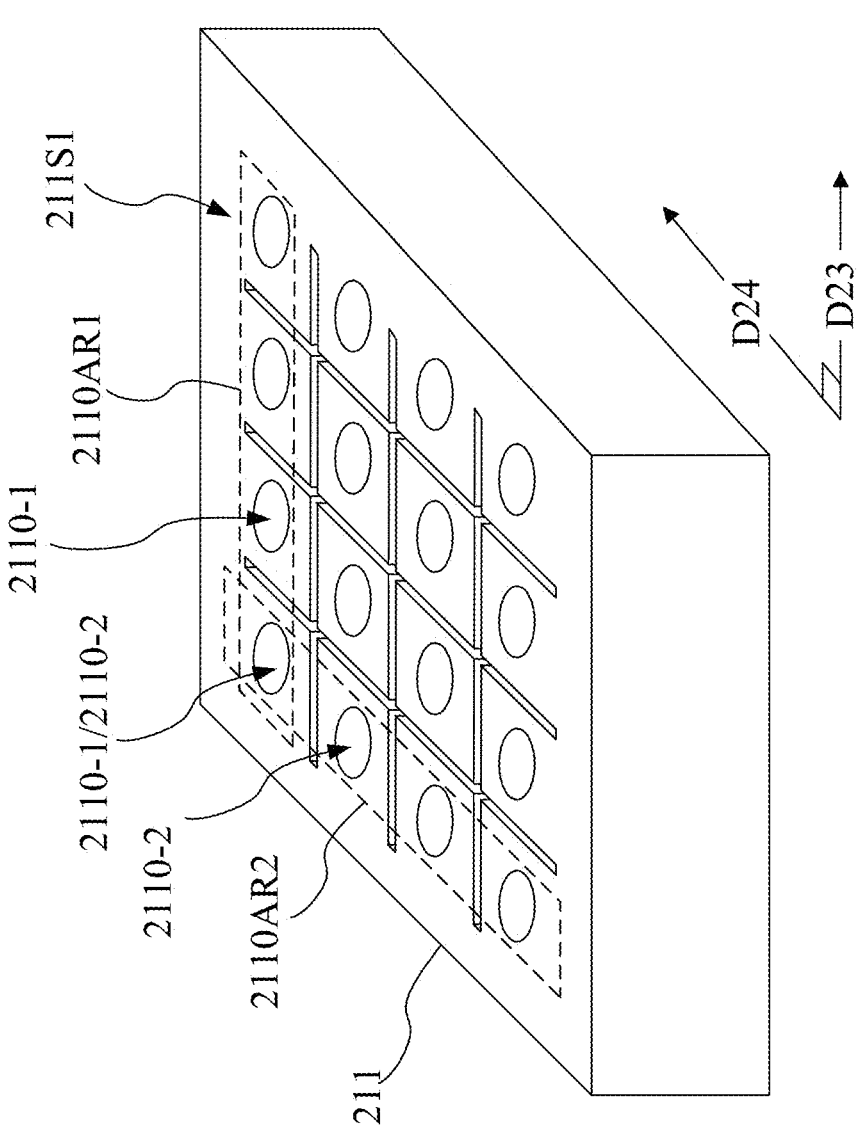
FIG. 2G is a perspective view of the body according to some embodiments of the present disclosure.
Figure 2H:
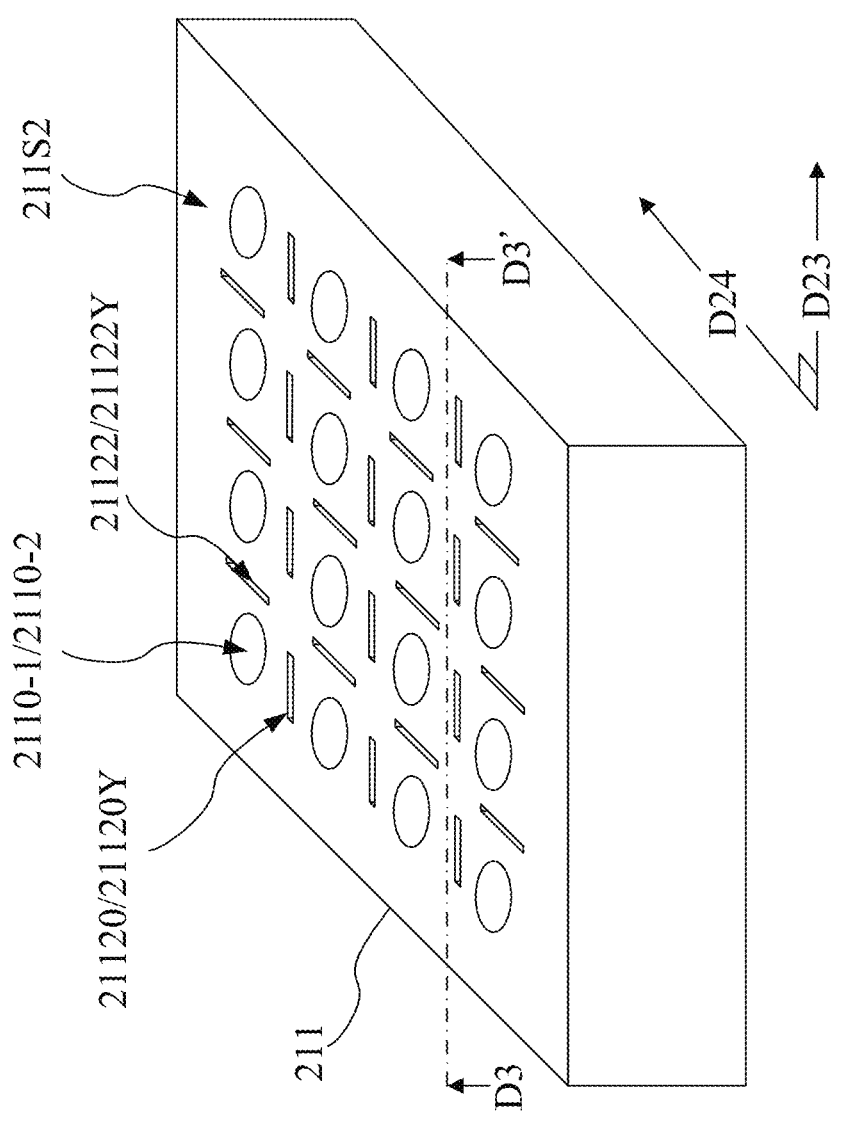
FIG. 2H is a perspective view of the body according to some embodiments of the present disclosure.
Figure 2I:
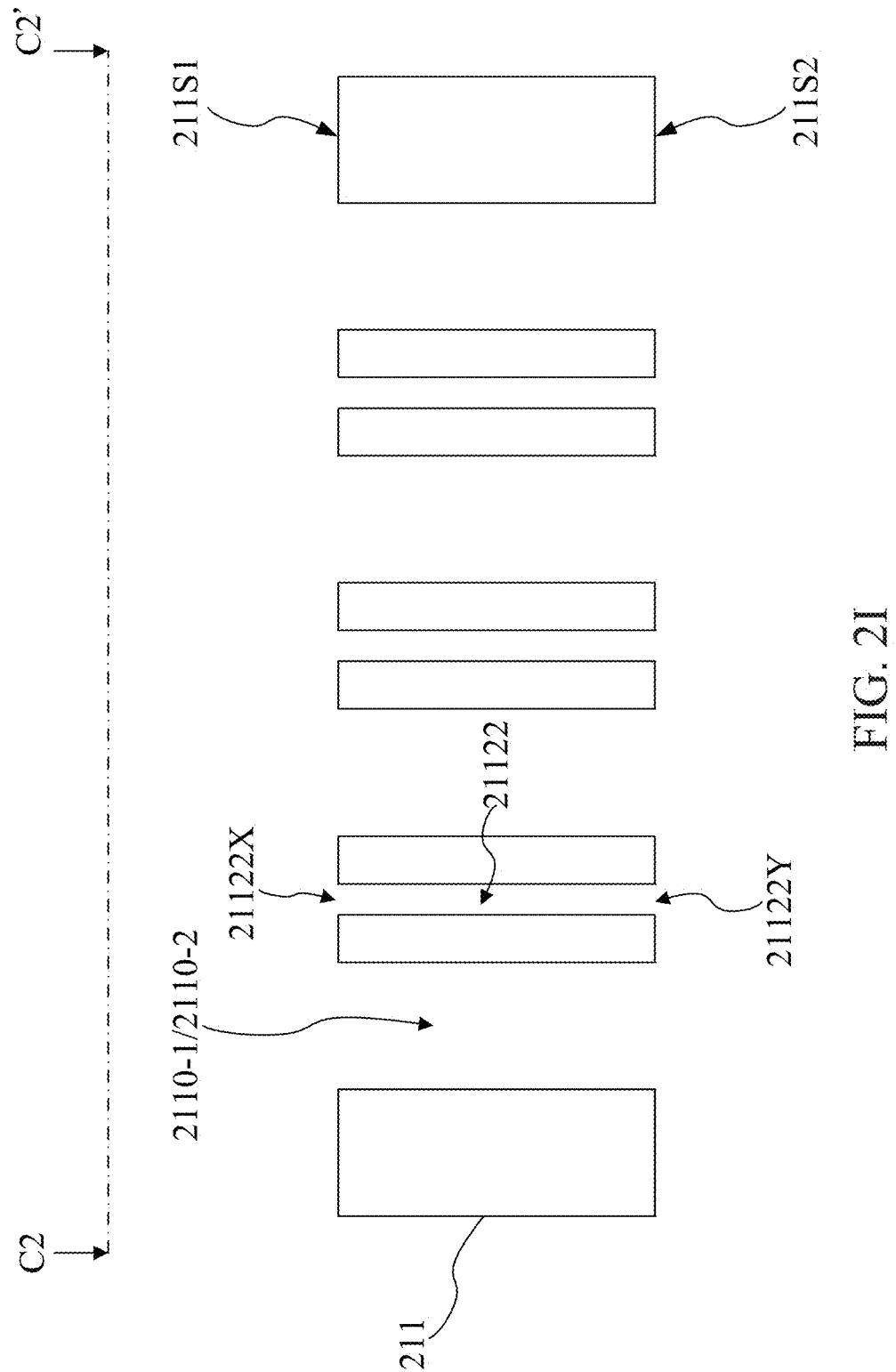
FIG. 2I is a cross-sectional view of the body according to some embodiments of the present disclosure.
Figure 2J:
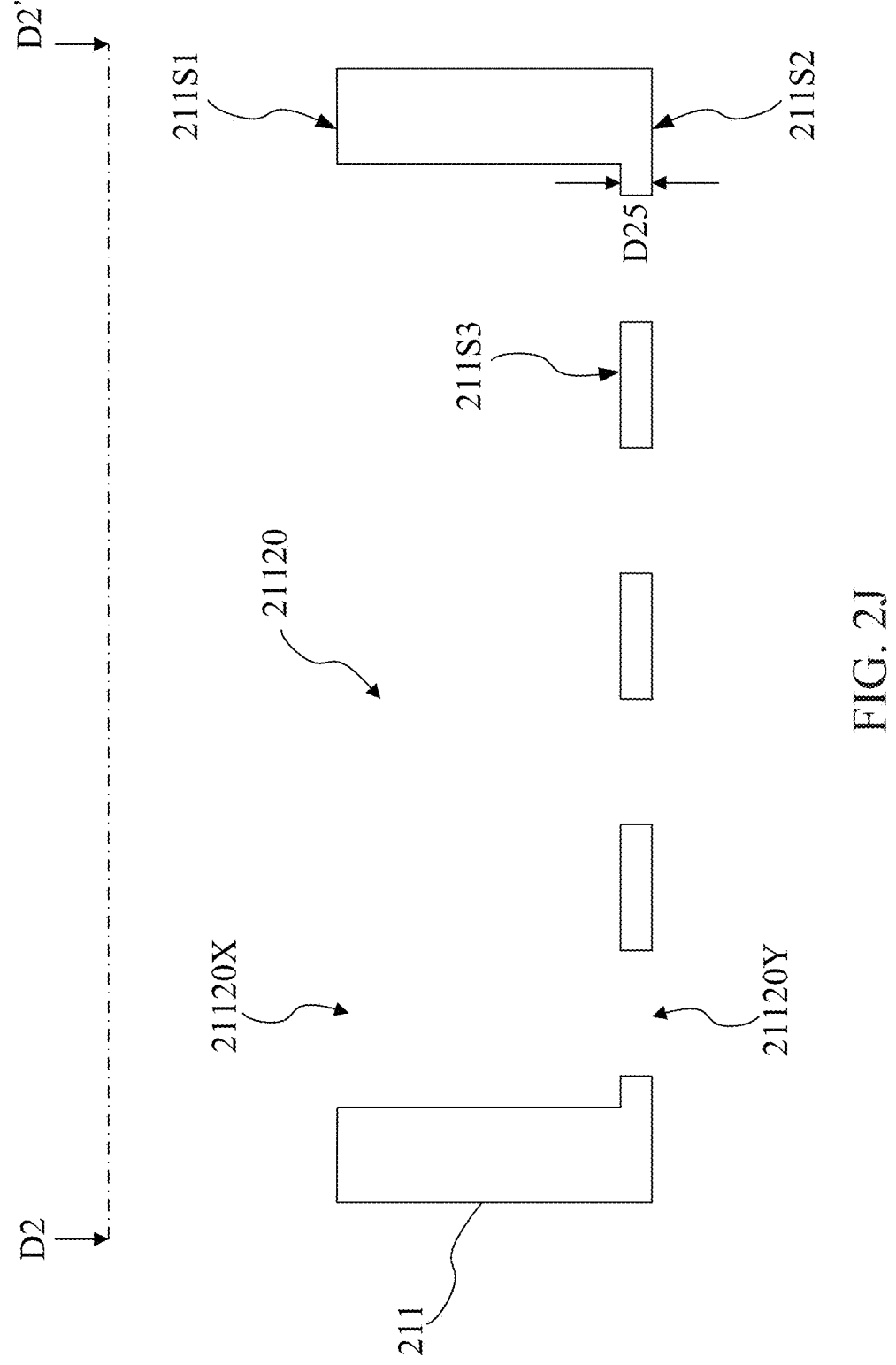
FIG. 2J is a cross-sectional view of the body according to some embodiments of the present disclosure.
Figure 2K:
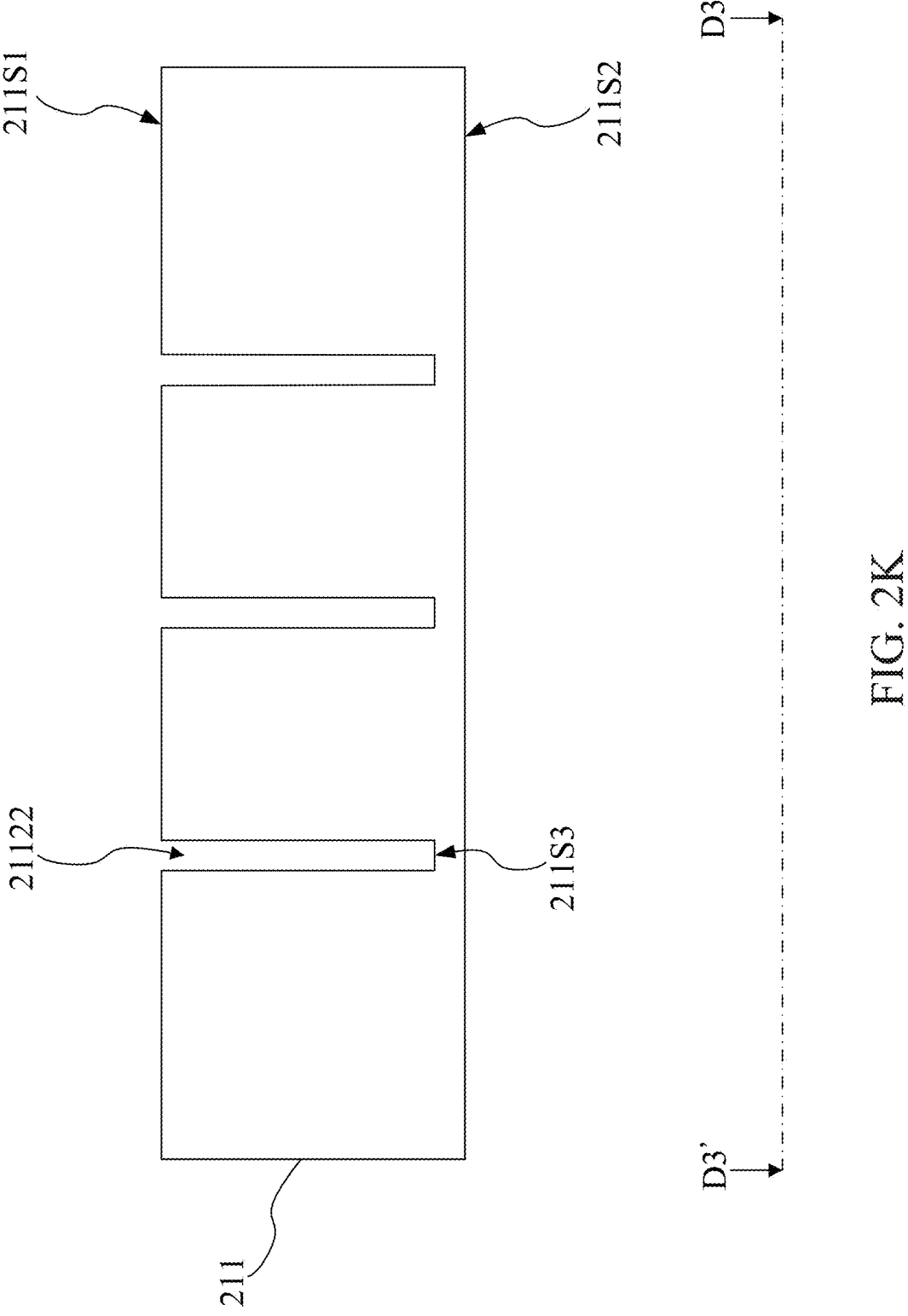
FIG. 2K is a cross-sectional view of the body according to some embodiments of the present disclosure.

Reference is made to FIG. 2F through FIG. 2K. FIGS. 2F and 2G are perspective views of the body 211 according to some embodiments of the present disclosure. FIG. 2H is another perspective view of the body 211 according to some embodiments of the present disclosure. FIG. 2I through FIG. 2K are cross-sectional views of the body 211 according to some embodiments of the present disclosure. Specifically, the body 211 is block-shaped (for example, in a shape of a cubic block) and has multiple first through hole arrays 2110AR1 and multiple second through hole arrays 2110AR2. Each first through hole array 2110AR1 includes a plurality of first through holes 2110-1 aligned with a first direction D23. Each second through hole array 2110AR2 includes a plurality of second through holes 2110-2 aligned with a second direction D24. In these embodiments, the first direction D23 and the second direction D24 are basically perpendicular to each other, however, the present disclosure is not limited thereto. In some embodiments, one of the first through holes 2110-1 and one of the second through holes 2110-2 can be the same through hole, whereas the first through holes are distinguished from the second through holes according to the angles of different through hole arrays.

The body 211 has a plurality of first grooves 21120 and a plurality of second grooves 21122. Each of the first grooves 21120 is extended in the first direction D23 and disposed between two adjacent first through hole arrays 2110AR1. Each of the second grooves 21122 is extended in the second direction D24 and disposed between two adjacent second through hole arrays 2110AR2. In some embodiments, the first grooves 21120 and the second grooves 21122 are staggered.

In some embodiments, the plurality of shield components 213 include a plurality of first shield components 2131 and a plurality of second shield components 2133. The plurality of first shield components 2131 are inserted into the plurality of first grooves 21120 of the body 211 from the upper surface 211S1, respectively. The plurality of second shield components 2133 are inserted into the plurality of second grooves 21122 of the body 211 from the upper surface 211S1, respectively. The first shield components 2131 and the second shield components 2133 are staggered. The plurality of first through holes 2110-1 and the plurality of second through holes 2110-2 receive the plurality of pogo pins 23.

In some embodiments, each of the first shield components 2131 has a first surface 2131S, and each of the second shield components 2133 has a second surface 2133S. The first surfaces 2131S, the second surfaces 2133S and the lower surface 211S2 substantially face the same direction. The first grooves 21120 and the second grooves 21122 share a bottom surface 211S3 inside the body 211. The body 211 has a thickness D25 between the bottom surface 211S3 and the lower surface 211S2. Upon the insertion of the first shield components 2131 into the corresponding grooves, the first surfaces 2131S adjoin the bottom surface 211S3 of the body 211, whereas a first distance D21 is defined between each first surface 2131S and the lower surface 211S2. Upon the insertion of the second shield components 2133 into the corresponding grooves, the second surfaces 2133S adjoin the bottom surface 211S3 of the body 211, whereas a second distance D22 is defined between each second surface 2133S and the lower surface 211S2. In some embodiments, the thickness D25, the first distance D21 and the second distance D22 are equal to one another.

In some embodiments, two first grooves 21120 and two second grooves 21122 are arranged in a pattern that looks like a pound sign (#), and a through hole (for example, the first through holes 2110-1 or the second through holes 2110-2) is formed in each of nine cells of the pound sign. Given the pattern, at least one groove (for example, first groove 21120 or second groove 21122) is disposed between any two adjacent through holes (for example, the first through holes 2110-1 and the second through holes 2110-2). The first shield components 2131 inserted into the first grooves 21120 or the second shield components 2133 inserted into the second grooves 21122 are disposed between the pogo pins 23 in any two adjacent through holes (for example, the first through holes 2110-1 and the second through holes 2110-2).

In some embodiments, each of the first grooves 21120 has a first opening 21120X on the upper surface 211S1 of the body 211 and has a plurality of second openings 21120Y on the lower surface 211S2 of the body 211. The second openings 21120Y are formed along the direction of the extension of the first grooves 21120 and spaced apart from each other. The dimension of each of the second openings 21120Y is smaller than the dimension of the first opening 21120X. The first shield components 2131 have a plurality of protrusion portions 2131P. When the first shield components 2131 are inserted into the first grooves 21120 via the first openings 21120X, the protrusion portions 2131P penetrate through the corresponding second openings 21120Y of the first grooves 21120 and protrude from the lower surface 211S2 (i.e., the protrusion portions 2131P protrude from and exceed the lower surface 211S2).

In some embodiments, each of the second grooves 21122 has a third opening 21122X on the upper surface 211S1 of the body 211 and each have a plurality of fourth openings 21122Y on the lower surface 211S2 of the body 211. The fourth openings 21122Y are formed along the direction of the extension of the second grooves 21122 and spaced apart from each other. The dimension of each of the fourth openings 21122Y is smaller than the dimension of the third opening 21122X. The second shield components 2133 have a plurality of protrusion portions 2133P. When the second shield components 2133 are inserted into the second grooves 21122 via the third openings 21122X, the protrusion portions 2133P penetrate through the corresponding fourth openings 21122Y of the second grooves 21122 and protrude from the lower surface 211S2 (i.e., the protrusion portions 2133P protrude from and exceed the lower surface 211S2).

In some embodiments, each first protrusion portion 2131P of the first shield components 2131 has a third surface 2131PS, and all the third surfaces 2131PS are substantially coplanar. Each second protrusion portion 2133P of the second shield components 2133 has a fourth surface 2133PS, and all fourth surfaces 2133PS are substantially coplanar. In some embodiments, all of the third surfaces 2131PS and all of fourth surfaces 2133PS are substantially coplanar.

Figure 2L:
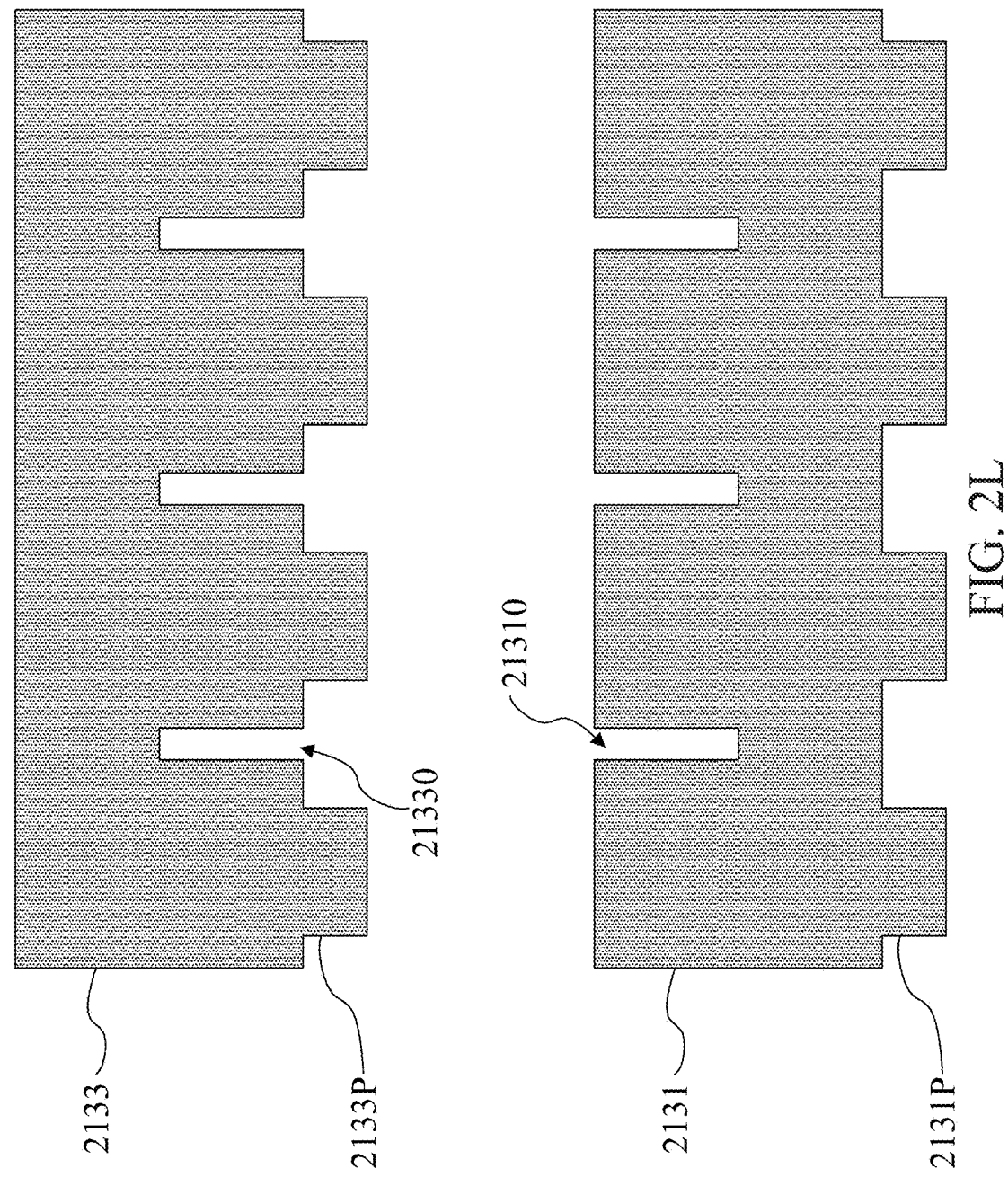
FIG. 2L is a cross-sectional view of shield components according to some embodiments of the present disclosure.

Referring to FIG. 2L, which is shown a cross-sectional view of the first shield components 2131 and the second shield components 2133 according to some embodiments of the present disclosure. Specifically, each first shield component 2131 has a plurality of first joints 21310, and each second shield component 2133 has a plurality of second joints 21330. When the first shield components 2131 and the second shield components 2133 are staggered, the first joints 21310 receive the second shield components 2133, and the second joints 21330 receive the first shield components 2131.

In some embodiments, the first joints 21310 and the second joints 21330 are slots and engaged with each other. In these embodiments, the depth of the first joints 21310 is substantially equal to half the height of the first shield components 2131, and the depth of the second joints 21330 is substantially equal to half the height of the second shield components 2133. When the first shield components 2131 and the second shield components 2133 have the same height, the height of the first and second shield components 2131, 2133 engaged with each other is equal to the original height of the first shield components 2131 or the second shield components 2133.

It should be noted that these embodiments are not restrictive of the implementation of the first shield components 2131 and the second shield components 2133. In some embodiments, the first shield components 2131 and the second shield components 2133 have the same height, and the sum of the depth of the first joint 21310 and the depth of the second joint 21330 is substantially equal to the height of the first shield components 2131 or the second shield components 2133, whereas the height of the first and second shield components 2131, 2133 engaged with each other is equal to the original height of the first shield components 2131 or the second shield components 2133. In some embodiments, the first shield components 2131 and the second shield components 2133 are monolithic (one-piece formed).

Therefore, owing to the structure of the socket assembly 21, when the pogo pins 13 received in two adjacent through holes (for example, the first through hole 2110-1 or the second through hole 2110-2) are used in the signal transmission during a chip test, the signal interference is effectively shielded by the first shield components 2131 or the second shield components 2133 disposed between two adjacent through holes (for example, the first through hole 2110-1 and the second through hole 2110-2), in which the first shield components 2131 and the second shield components 2133 are inserted into the first grooves 21120 and the second grooves 21122, respectively. The protrusion portions 2131P, 2133P of the first shield components 2131 and the second shield components 2133 increase the shielding range between the pogo pins 23 and enhance signal interference shielding.

Referring to FIG. 2A, for example, when the pogo pin 23A, 23B received in through holes 2110A, 2110B are used in the signal transmission during a chip test, the signal interference is effectively shield by the second shield components 2133A inserted into second grooves 21122A disposed between the through holes 2110A2110B. Furthermore, the protrusion portions 2133P of the second shield components 2133A increase the shielding range.

Figure 2M:
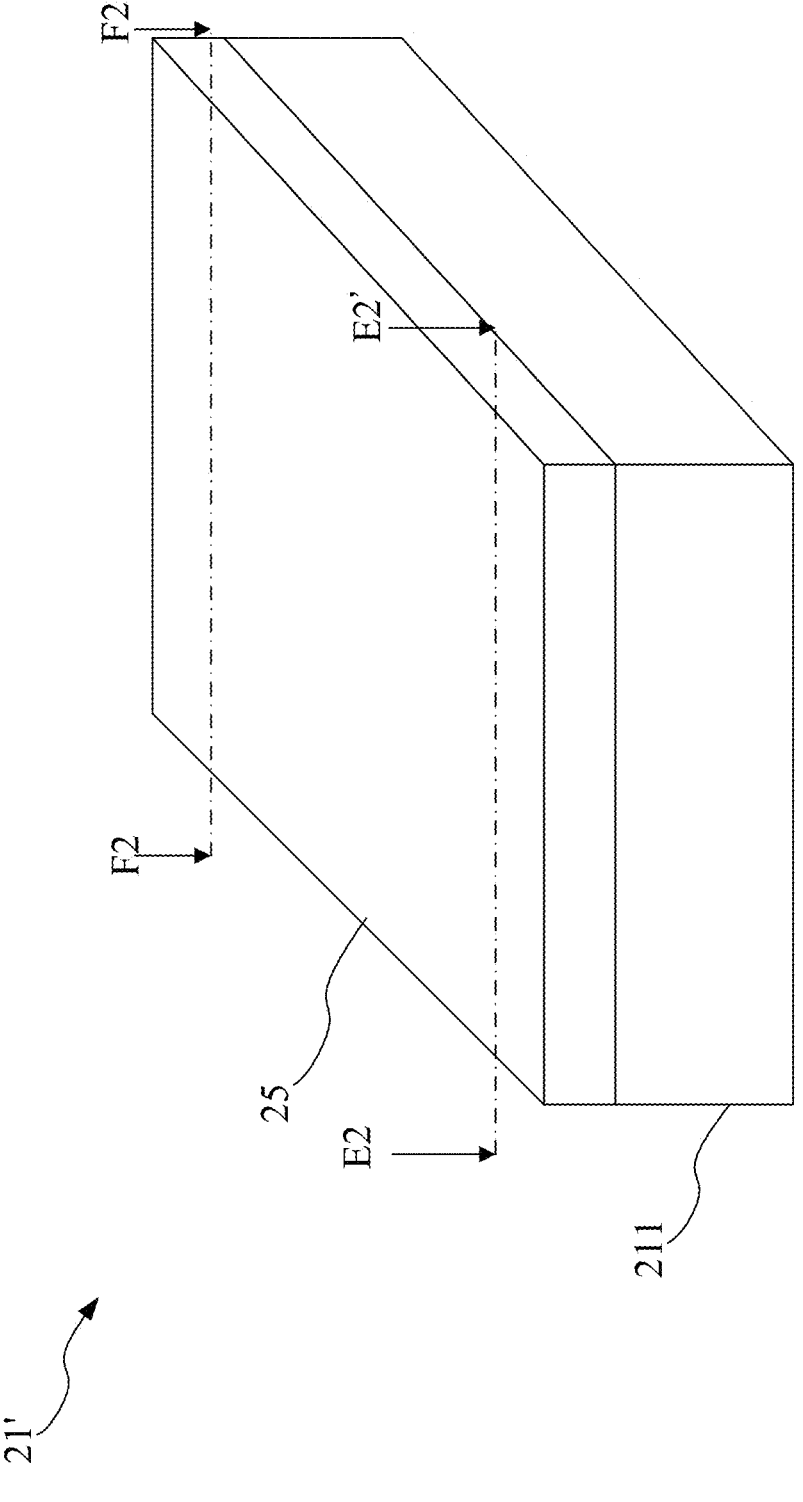
FIG. 2M is a perspective view of a socket assembly according to some embodiments of the present disclosure.
Figure 2N:
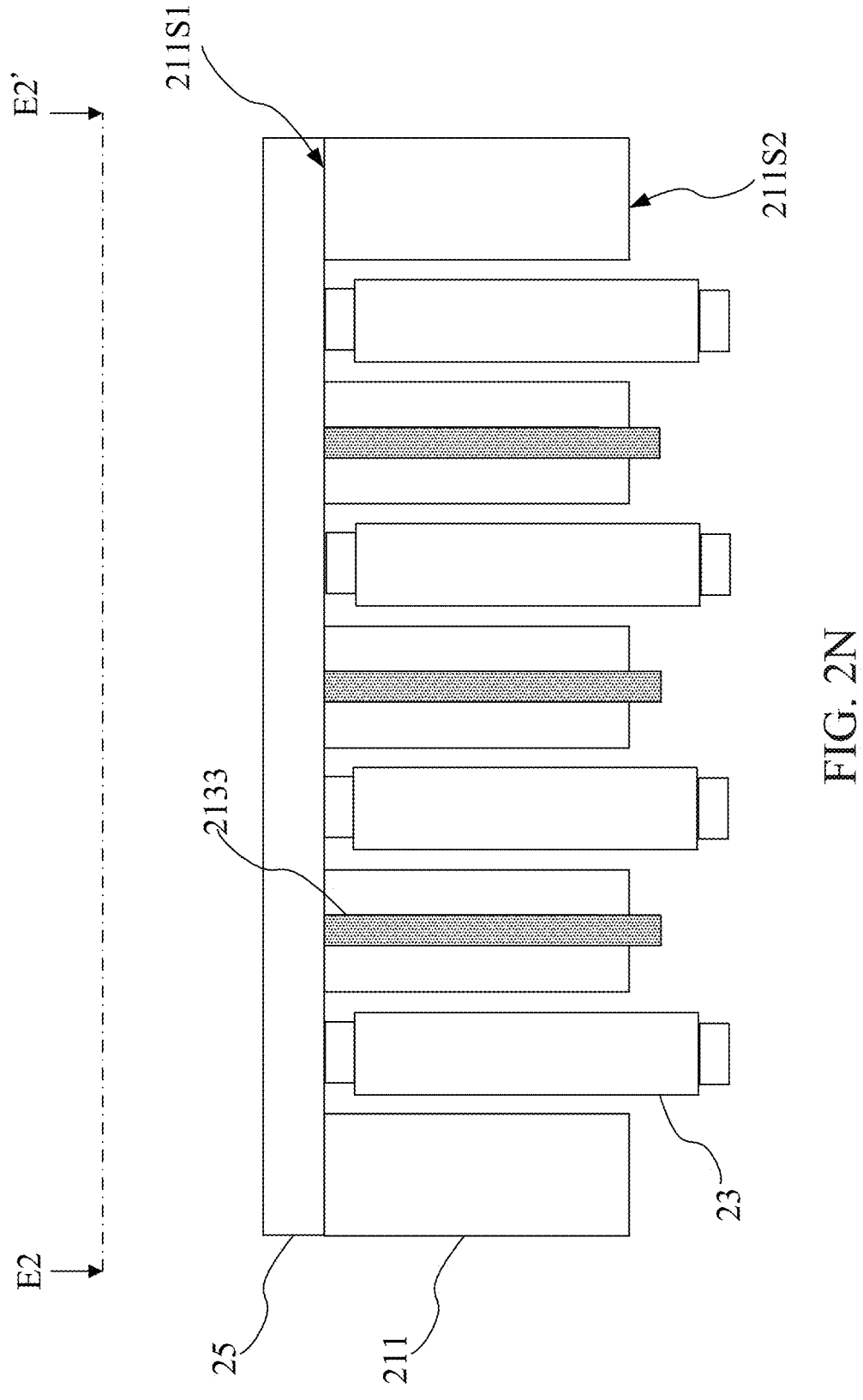
FIG. 2N is a cross-sectional view of the socket assembly according to some embodiments of the present disclosure.
Figure 2O:
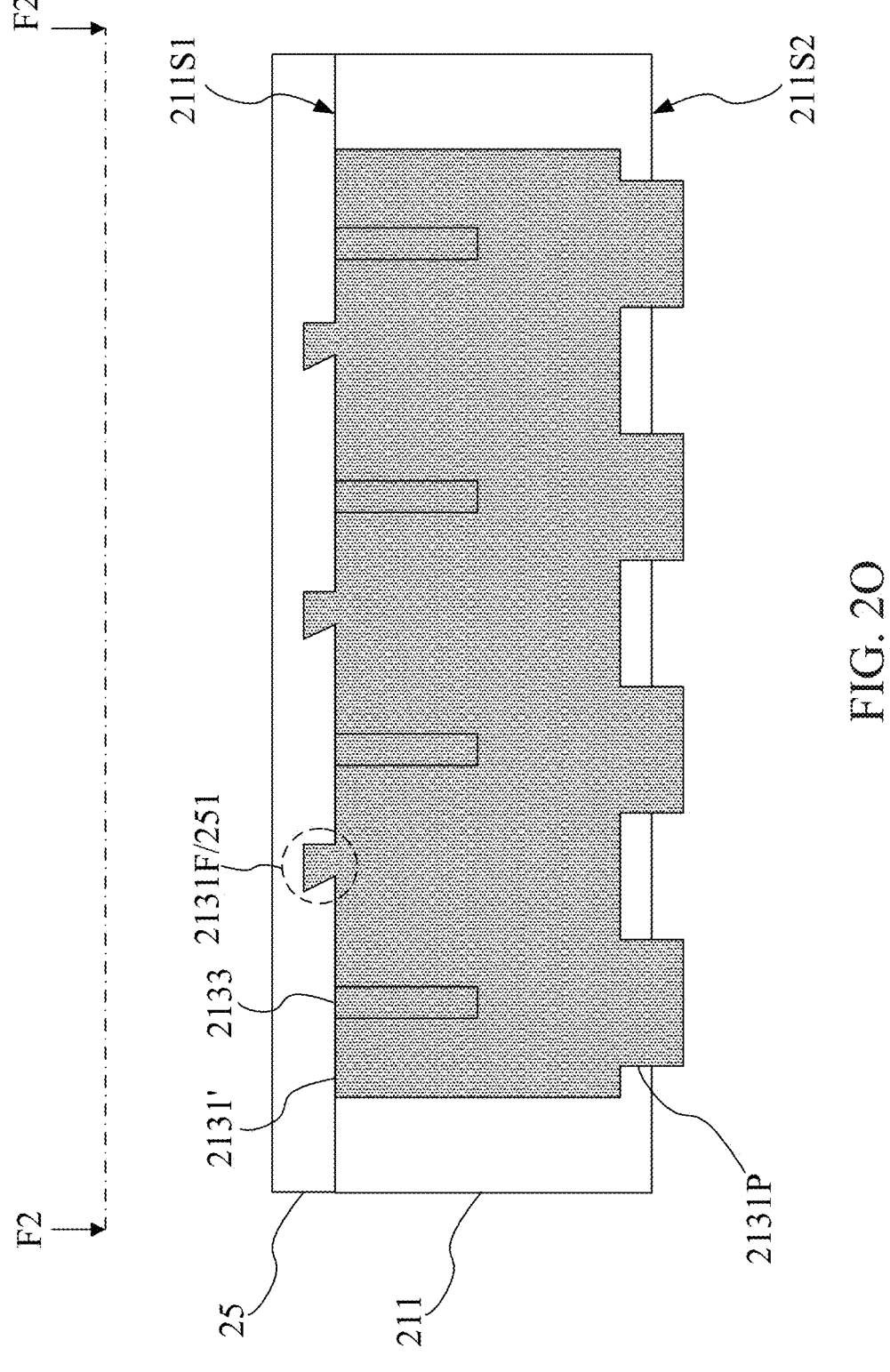
FIG. 2O is a cross-sectional view of the socket assembly according to some embodiments of the present disclosure.

Reference is made to FIG. 2M through FIG. 2O. FIG. 2M is a perspective view of a socket assembly 21' according to some embodiments of the present disclosure. FIG. 2N is a cross-sectional view of the socket assembly 21' according to some embodiments of the present disclosure. FIG. 2O is another cross-sectional view of the socket assembly 21' according to some embodiments of the present disclosure. Specifically, compared to the socket assembly 21, the socket assembly 21' further includes a circuit substrate 25. The circuit substrate 25 is disposed on the upper surface 211S1 of the body 211 and electrically connected to the pogo pins 23 to transmit test-related signals. The other end of each pogo pin 23 is configured to contact an object under test (not shown). In some embodiments, the first shield components 2131, the second shield components 2133 and the circuit substrate 25 are electrically connected so as to form a ground loop.

In some embodiments, the socket assembly 21' includes a first shield component 2131'. Compared with the first shield components 2131, the first shield component 2131' has a first fixing structure 2131F. The circuit substrate 25 has a second fixing structure 251 corresponding to the shape of the first fixing structure 2131F. The first fixing structure 2131F and the second fixing structure 251 can be engaged with each other, allowing the first shield component 2131' and the circuit substrate 25 to be firmly coupled together. It should be noted that, in these embodiments, the first fixing structure 2131F is hook-shaped, and the second fixing structure 251 is notch-shaped corresponding to the hook-shaped first fixing structure 2131F, however, the present disclosure is not limited thereto. Thus, in a variant embodiment, the second fixing structure 251 is hook-shaped, and the first fixing structure 2131F is notch-shaped corresponding to the hook-shaped second fixing structure 251. In some embodiments, the first fixing structure 2131F of the first shield component 2131' and the second fixing structure 251 of the circuit substrate 25 are electrically connected so as to form a ground loop. Similarly, the second shield component 2133 has the aforesaid fixing structure and thus can be engaged with the circuit substrate 25, and related details are not reiterated for the sake of brevity.

Figure 2P:
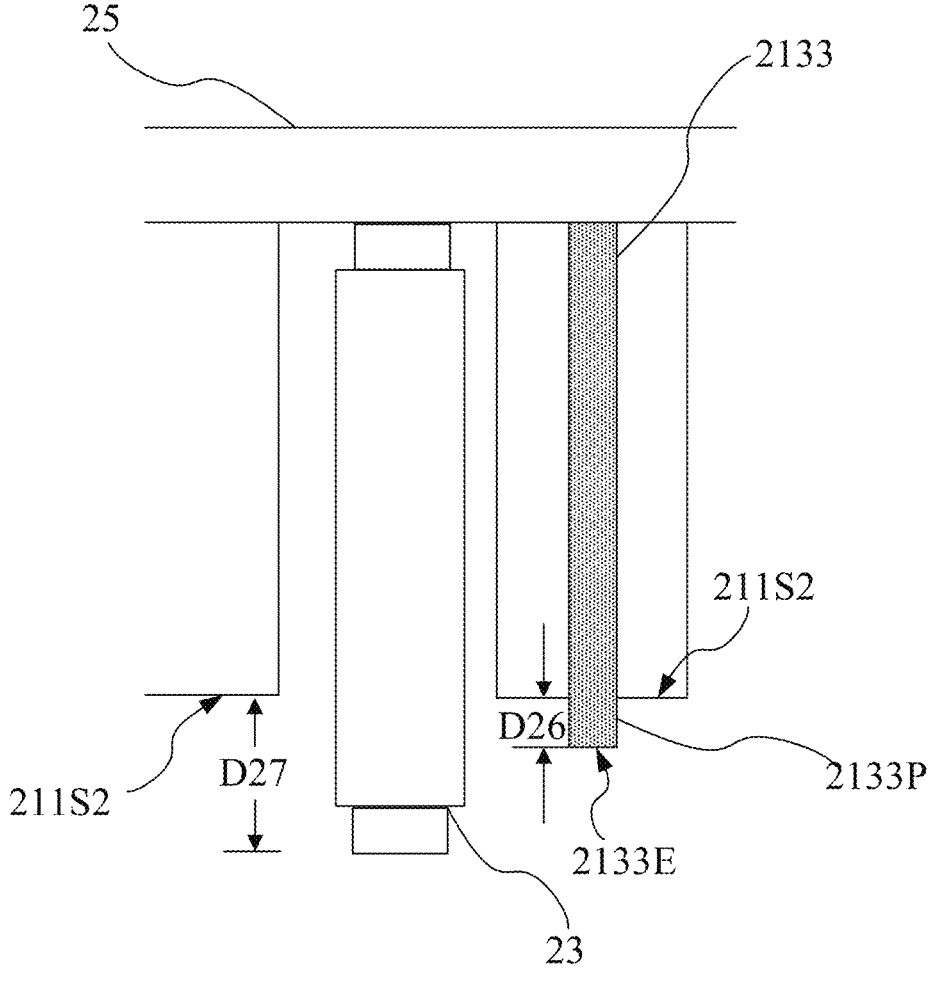
FIG. 2P is an enlarged, cross-sectional view of the socket assembly according to some embodiments of the present disclosure.

Referring to FIG. 2P, which is shown an enlarged view of a portion of FIG. 2N. In some embodiments, a third distance D26 is defined between an end 2133E of each protrusion portion 2133P of the second shield components 2133 and the lower surface 211S2 (i.e., between the third surface 2131PS and the lower surface 211S2), and a fourth distance D27 is defined between the lower surface 211S2 and an adjacent one of the pogo pins 23 received in the through holes respectively. The fourth distance D27 is greater than the third distance D26, and the difference therebetween is greater than or equal to the compression stroke of the pogo pins 23 so as to prevent the compressed pogo pins 23 from engaging with the protrusion portions 2133P of the second shield components 2133. Similarly, the first shield components 2131 also has the aforesaid technical features to prevent the compressed pogo pins 23 from engaging with the protrusion portions 2131P of the first shield components 2131, and related details are not reiterated for the sake of brevity.

Figure 3:
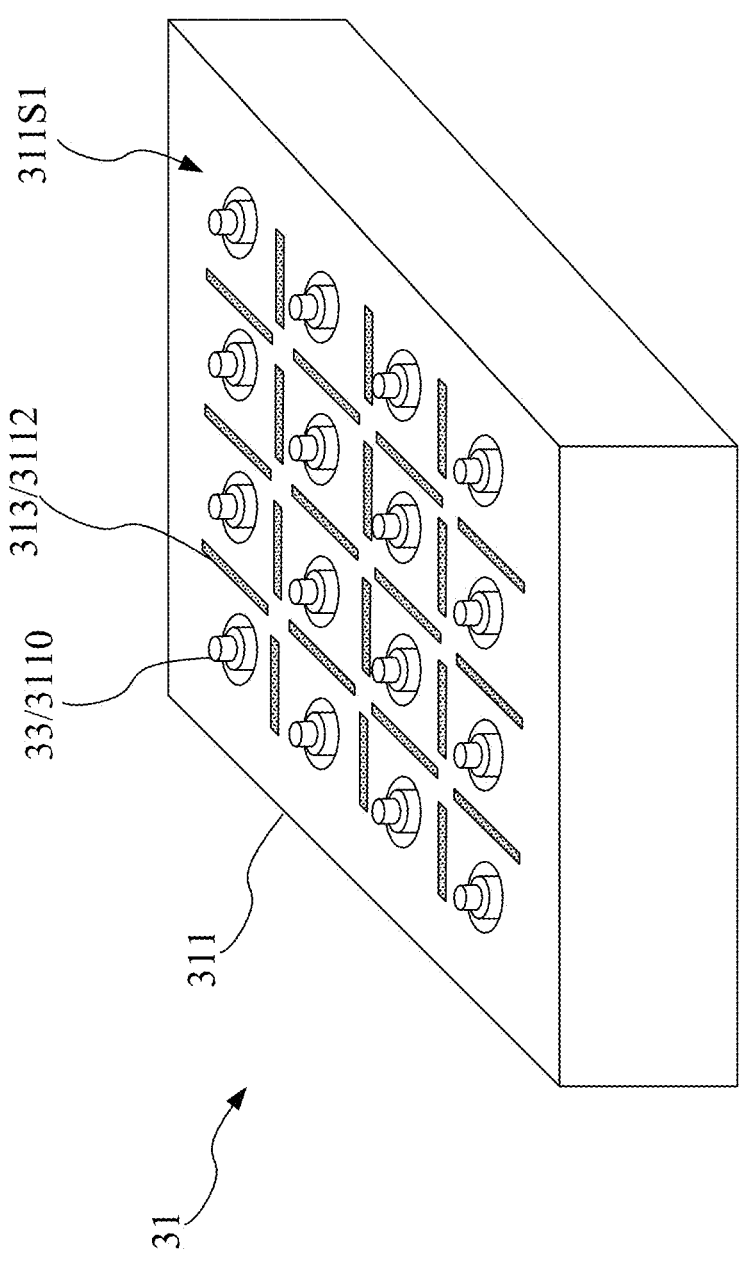
FIG. 3 is a perspective view of a socket assembly according to some embodiments of the present disclosure.

Referring to FIG. 3, which is shown a perspective view of a socket assembly 31 according to some embodiments of the present disclosure. Specifically, the socket assembly 31 includes a body 311 and multiple shield components 313. The body 311 has an upper surface 311S1. The body 311 has multiple through holes 3110 and multiple independent grooves 3112. The grooves 3112 are not in communication with each other. Each groove 3112 is disposed between two adjacent through holes 3110. The shield components 313 are insertedly disposed in the grooves 3112. The through holes 3110 receive multiple pogo pins 33.

Figure 4A:
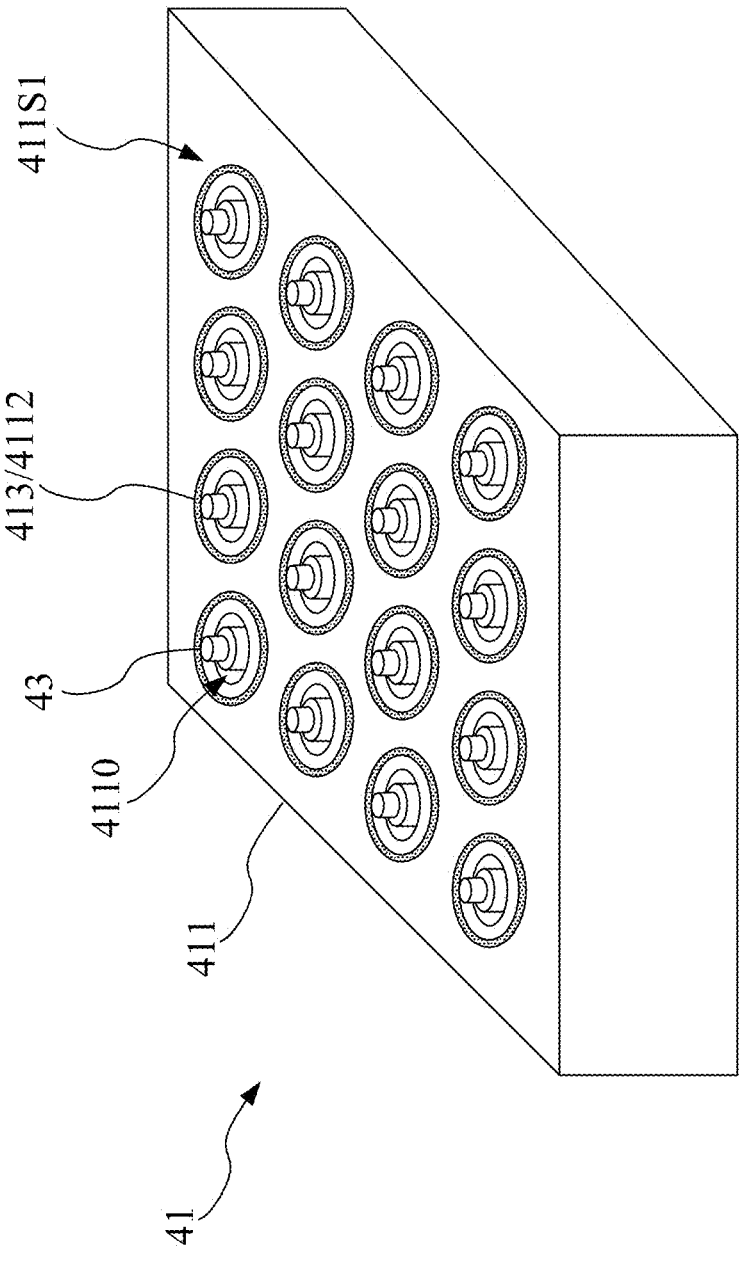
FIG. 4A is a cross-sectional view of a socket assembly according to some embodiments of the present disclosure.

Referring to FIG. 4A, which is shown a perspective view of a socket assembly 41 according to some embodiments of the present disclosure. Specifically, the socket assembly 41 includes a body 411 and a plurality of shield components 413. The body 411 has an upper surface 411S1. The body 411 has a plurality of through holes 4110 and a plurality of grooves 4112. Two grooves 4112 are disposed between any two adjacent through holes 4110. The plurality of shield components 413 are insertedly disposed in the plurality of grooves 4112. The plurality of through holes 4110 receive a plurality of pogo pins 43.

Figure 4B:
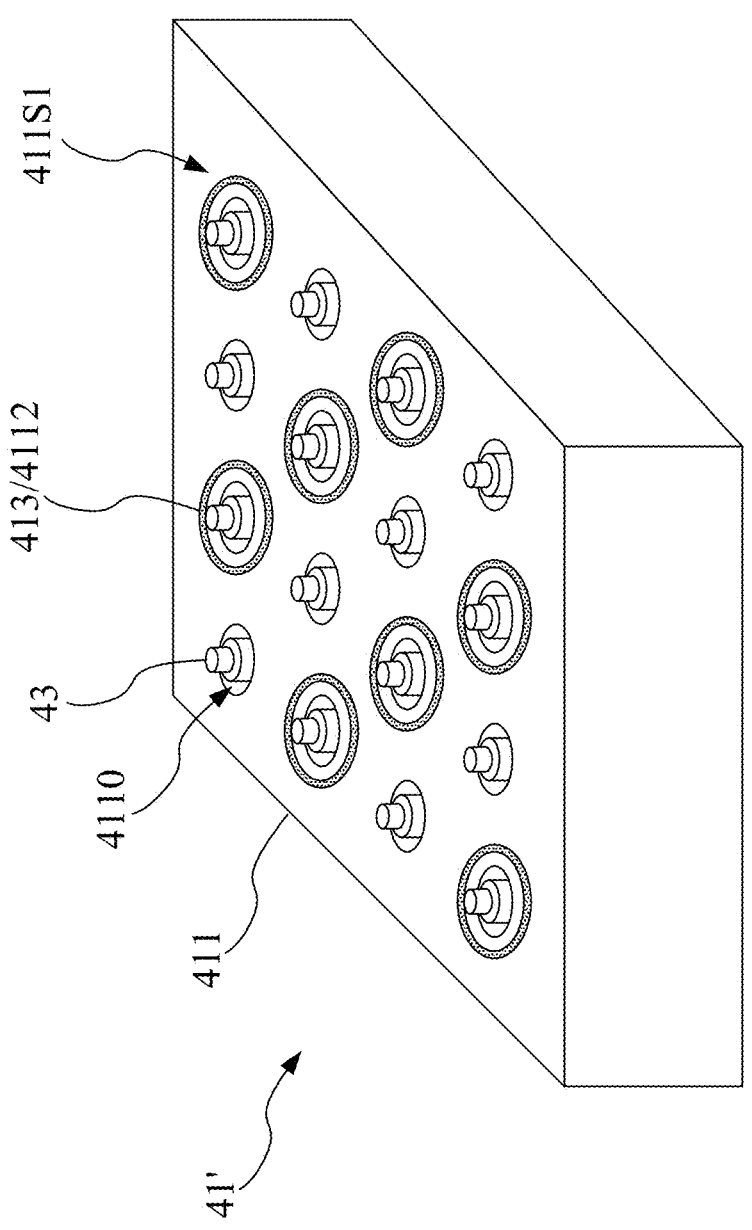
FIG. 4B is a cross-sectional view of a socket assembly according to some embodiments of the present disclosure.

Referring to FIG. 4B, there is shown a perspective view of a socket assembly 41' according to some embodiments of the present disclosure. Specifically, the difference between the socket assembly 41' and the socket assembly 41 is that the grooves 4112 of the socket assembly 41' and the shield components 413 are interleaved, which is also able to achieve the effect of shielding.

In some embodiments, the width of groove is smaller than the thickness of the corresponding pogo pin. In some embodiments, the material of the body includes an insulating material for precluding electrical contact between the pogo pins, and the body is monolithic (for example, by injection molding) to form a block-shaped solid that has through holes and grooves. In some embodiments, the material which the shield components are made from includes a metallic material (for example, an electrically conductive metallic material) for shielding signal interference.

In these embodiments, the shield components are disposed between any two pogo pins, but the present disclosure is not limited thereto. Well-known among persons skilled in the art is that, in some embodiments, it is not necessary for a signal generated from every pogo pin to be shielded, rendering it feasible to provide the shield components only between the pogo pins required to be shielded (for example, pogo pins for detecting high-frequency signals).

Furthermore, it should be noted that the pogo pins in the present disclosure are provided for illustrative purposes. Various probe pins are within the contemplated scope of the present disclosure.

In the embodiments, for the sake of brevity and ease of comprehension, although like components may be shown in the accompanying drawings, only one of the like components is denoted in the accompanying drawings, without imposing limitations on the disclosure. Persons skilled in the art should be able to perceive and comprehend like components shown in the accompanying drawings.

Therefore, the embodiments of the disclosure provide socket assemblies each comprising shield components embedded therein and adapted to achieve shielding between pogo pins so as to reduce signal interference in the course of testing and thereby effectively enhance testing stability and precision.

Although the disclosure and advantages thereof are described above, persons skilled in the art understand that various changes, replacements and substitutions may be made to the disclosure without departing from the spirit and scope defined in the appended claims of the disclosure. For instance, the aforesaid processes may be implemented with different methods and replaced with any other processes or a combination thereof.

The scope of the disclosure is not restricted to specific embodiments of any processes, machines, manufacturing, matter compositions, means, methods and steps described herein. The disclosure described herein enables persons skilled in the art to implement the disclosure with any existing or potential processes, machines, manufacturing, matter compositions, means, methods or steps having the same function or capable of achieving substantially the same result as disclosed in the aforesaid embodiments. Therefore, these processes, machines, manufacturing, matter composi-tions, means, methods and steps fall within the scope of the appended claims of the disclosure.

What is claimed is:

1. A socket assembly used with a chip test socket, the socket assembly comprising:
   a body having:
      an upper surface;
      a lower surface opposite to the upper surface;
      a plurality of first through hole arrays each comprising a plurality of first through holes aligned with a first direction;
      a plurality of second through hole arrays each com-prising a plurality of second through holes aligned with a second direction;
      a plurality of first grooves each extending in the first direction,
   wherein any two adjacent first through hole arrays has one of the first grooves disposed therebetween; and
      a plurality of second grooves each extending in the second direction, wherein any two adjacent second through hole arrays has one of the second grooves disposed therebetween;
   a plurality of first shield components each having a first surface and being inserted into the first grooves from the upper surface;
   a plurality of second shield components each having a second surface and being inserted into the second grooves from the upper surface; and
   a plurality of pogo pins disposed in the first through holes and the second through holes,
   wherein a first distance is defined between each of the first surfaces of the first shield components and the lower surface,
   wherein a second distance is defined between each of the second surfaces of the second shield components and the lower surface.

2. The socket assembly of claim 1, wherein the first surfaces are coplanar, and the second surfaces are coplanar.

3. The socket assembly of claim 2, wherein the first surfaces and the second surfaces are coplanar.

4. The socket assembly of claim 1, wherein the first distance is equal to the second distance.

5. The socket assembly of claim 1, wherein the first direction is perpendicular to the second direction, the first grooves and the second grooves are staggered, and the first shield components and the second shield components are staggered.

6. The socket assembly of claim 5, wherein each of the first shield components has a plurality of first joints, and the first joints receive the second shield components.

7. The socket assembly of claim 6, wherein each of the second shield components has a plurality of second joints, and the second joints receive the first shield components.

8. The socket assembly of claim 1, wherein each of the first grooves has a first opening on the upper surface of the body and a plurality of second openings on the lower surface of the body, wherein a dimension of each of the second openings is smaller than a dimension of the first opening, and
   each of the second grooves has a third opening on the upper surface of the body and a plurality of fourth openings on the lower surface of the body, wherein a dimension of each of the fourth openings is smaller than a dimension of the third opening.

9. The socket assembly of claim 8, wherein at least one of the first shield components has a plurality of first protrusion portions, the first protrusion portions are penetratingly dis-posed in the second openings of the first grooves, respec-tively, and the first protrusion portions protrude from the lower surface.

10. The socket assembly of claim 9, wherein at least one of the second shield components has a plurality of second protrusion portions, the second protrusion portions are pen-etratingly disposed in the fourth openings of the second grooves, respectively, and the second protrusion portions protrude from the lower surface.

11. The socket assembly of claim 10, wherein a third distance is defined between an end of each of the first and second protrusion portions and the lower surface, when a first pogo pin of the pogo pins is received in a corresponding one of through holes, a fourth distance is defined between an end of the first pogo pin and the lower surface, and a difference between the fourth distance and the third distance is greater than or equal to a compression stroke of the first pogo pin.

12. The socket assembly of claim 10, wherein each of the first protrusion portions has a third surface, the third surfaces of the first protrusions are coplanar, and each of the second protrusion portions has a fourth surface, the fourth surfaces of the second protrusion portions are coplanar.

13. The socket assembly of claim 12, wherein the third surfaces and the fourth surfaces are coplanar.

14. The socket assembly of claim 1, further comprising a circuit substrate disposed on the upper surface of the body, wherein the first shield components and the second shield components are electrically connected to the circuit sub-strate so as to form a ground loop.

15. The socket assembly of claim 1, further comprising a circuit substrate disposed on the upper surface of the body, wherein the first shield components and the second shield components have a plurality of first fixing structures engag-ing with a plurality of second fixing structures of the circuit substrate.

16. The socket assembly of claim 15, wherein the first fixing structures are electrically connected to the second fixing structures.

17. The socket assembly of claim 1, wherein a width of the first grooves and a width of the second grooves are less than a thickness of the pogo pins.

18. The socket assembly of claim 1, wherein the body is made from an insulating material, and a material of the first shield components and the second shield components com-prises a conductive metallic material.

19. The socket assembly of claim 1, wherein the first grooves and the second grooves share a bottom surface in the body, and a thickness is defined between the bottom surface in the body and the lower surface of the body.

20. A socket assembly, comprising:
   a body having:
      a plurality of through holes, wherein at least a first portion of the through holes form a plurality of first through hole arrays, and at least a second portion of the through holes form a plurality of second through hole arrays; and a plurality of grooves, wherein at least a first portion of the grooves are disposed between any two adjacent first through hole arrays, and at least a second portion of the grooves are disposed between any two adjacent second through hole arrays;

a plurality of shield components insertedly disposed in the grooves; and a plurality of pogo pins disposed in the through holes.

\* \* \* \* \*